(12) United States Patent
Fazeel et al.

(10) Patent No.: US 10,771,108 B1
(45) Date of Patent: Sep. 8, 2020

(54) CROSSTALK CANCELLATION IN A RECEIVER

(71) Applicant: Cadence Design Systems, Inc., San Jose, CA (US)

(72) Inventors: H Md Shuaeb Fazeel, Bangalore (IN); Sachin Ramesh Gugwad, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/718,004

(22) Filed: Dec. 17, 2019

(51) Int. Cl.
*H04B 3/32* (2006.01)
*H01L 27/06* (2006.01)
*H01R 13/6464* (2011.01)

(52) U.S. Cl.
CPC ............ *H04B 3/32* (2013.01); *H01L 27/0629* (2013.01); *H01R 13/6464* (2013.01)

(58) Field of Classification Search
CPC ............. H01L 23/5222; H01L 27/0805; H01L 27/0629; H04B 3/32; H01R 13/6464
See application file for complete search history.

(56) References Cited

U.S. PATENT DOCUMENTS

| 5,889,752 | A * | 3/1999 | Maeda | G11B 7/005 |
| | | | | 369/53.33 |
| 2006/0023889 | A1* | 2/2006 | Suzaki | H04S 1/002 |
| | | | | 381/17 |
| 2006/0039551 | A1* | 2/2006 | Hossain | H01L 23/5222 |
| | | | | 379/417 |
| 2011/0069604 | A1* | 3/2011 | Schmukler | H03H 11/265 |
| | | | | 370/201 |
| 2011/0131458 | A1* | 6/2011 | Mozak | G11C 29/02 |
| | | | | 714/721 |
| 2013/0147547 | A1* | 6/2013 | Nalawade | G06F 30/36 |
| | | | | 327/551 |
| 2016/0173034 | A1* | 6/2016 | Lin | H03F 3/187 |
| | | | | 330/260 |
| 2016/0182046 | A1* | 6/2016 | Cai | H03K 19/00346 |
| | | | | 327/170 |
| 2017/0083475 | A1* | 3/2017 | Wu | G06F 13/124 |

OTHER PUBLICATIONS

Aprile, et al., "An Eight-Lane 7-Gb/s/pin Source Synchronous Single-Ended RX With Equalization and Far-End Crosstalk Cancellation for Backplane Channels", IEEE Journal of Solid-State Circuits, 53(3), (Mar. 2018), 12 pgs.

* cited by examiner

*Primary Examiner* — Khanh C Tran
(74) *Attorney, Agent, or Firm* — Schwegman Lundberg & Woessner, P.A.

(57) ABSTRACT

Embodiments relate to systems, methods, and computer-readable media to enable design and creation of crosstalk cancellation circuitry for a receiver (e.g. an AC coupled DDR5 receiver). One embodiment is a receiver apparatus with crosstalk victim and aggressors lines. The cancellation circuitry involves an amplifier and buffering circuitry to provide inductive and capacitive crosstalk cancellation voltages. Some embodiments can additionally involve circuitry for autozeroing modes for AC coupled receiver lines.

20 Claims, 13 Drawing Sheets

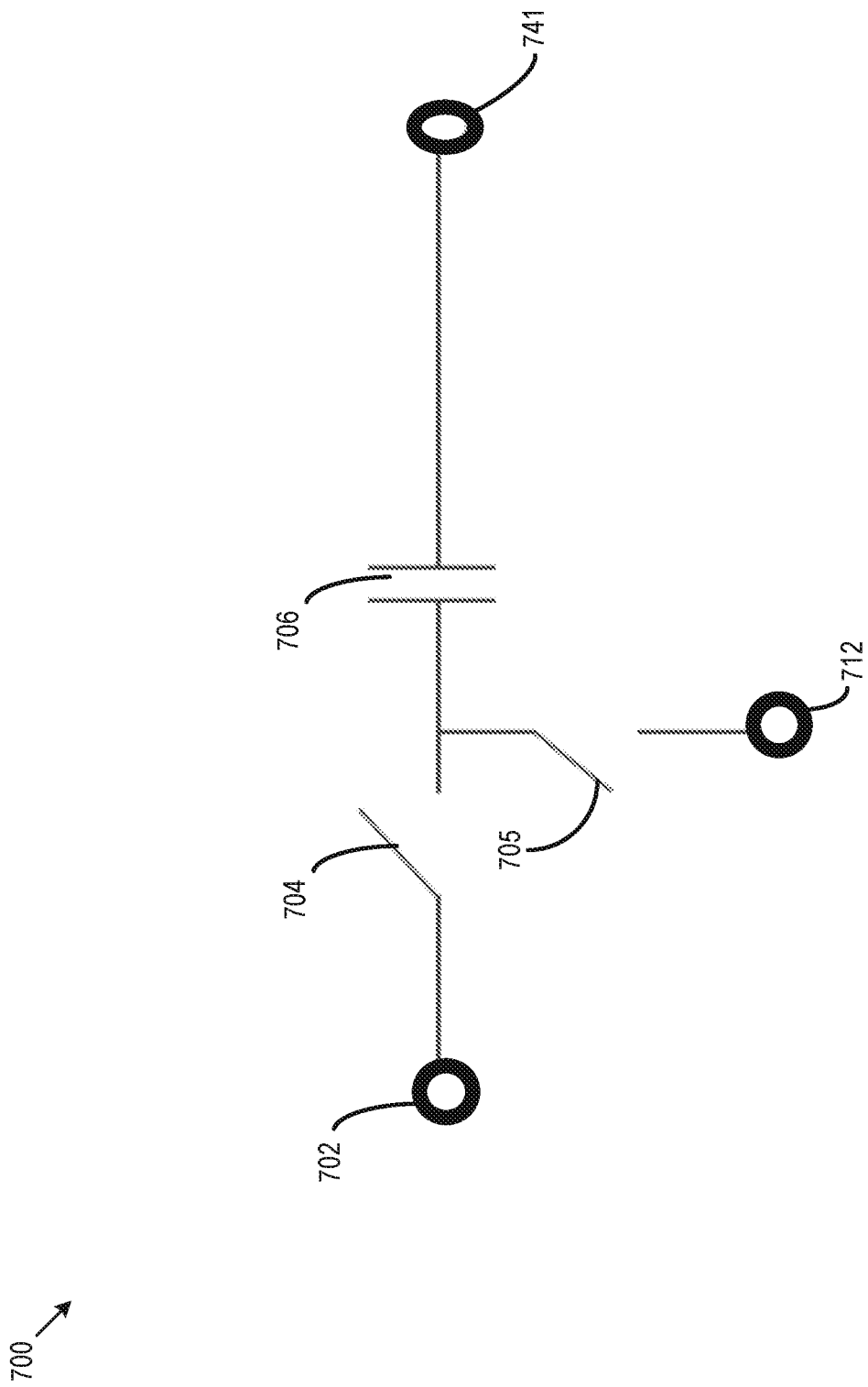

US 10,771,108 B1

CROSSTALK CANCELLATION IN A RECEIVER

TECHNICAL FIELD

Embodiments described herein relate to electronic circuits, electronic design automation (EDA), and to associated systems, methods, devices, and instructions for generation of circuit design files. Some embodiments pertain to microprocessor interface circuits with memory devices (e.g., synchronous dynamic random access memory (SDRAM)). Some embodiments particularly relate to memory interface receivers used in memory devices.

BACKGROUND

A typical computing machine is implemented with a microprocessor, memory, and a number of other modules depending on the function to be performed by the computing machine. Double data rate (DDR) random access memory (RAM) is a particular type of RAM commonly used in current technology that performs two read accesses or two write accesses per clock cycle. Both microprocessors and DDR RAM operate on various different power supply voltages. Interface circuits that can convert between different signal levels and different drive levels are used to allow for compatible communications between microprocessors and memory devices.

EDA is a category of systems for assisting with the design of electronic systems and devices. Large, integrated circuit designs are often assembled from previously designed arrangements. This enables reduced turnaround times for generation of an integrated circuit. Schematic and layout information for such arrangement portions of a design may be exchanged or licensed as intellectual property.

BRIEF DESCRIPTION OF THE DRAWINGS

FIG. 7 illustrates aspects of crosstalk cancellation in a receiver in accordance with some embodiments.

DETAILED DESCRIPTION

Embodiments described herein relate to microprocessor interface circuits with memory devices. Interface circuits help with enhancing speed and quality of data exchange by using special techniques to handle harsh interface conditions, and embodiments described herein include innovations to meet memory operating standards while handling such condition. For example, to achieve higher bandwidth per pin for applications such as enterprise servers, mobile applications and high end laptops, high speed memory access protocols such as a standard for Double Data Rate 5 Synchronous Dynamic Random-Access Memory (DDR5) with speeds up to 5.6 gigabits per second (Gbps) are being introduced. In highly dense high speed DDR5 systems, the crosstalk from neighboring channels on a victim line becomes significant and degrades the timing margins available for detection of data. DDR5 is a single ended protocol and hence crosstalk is not cancelled by interleaved routing as in a differential protocol. DDR5 systems are high in dense tightly packed channels where the crosstalk due to mutual inductance and mutual capacitance between lines is significant. Inductive/capacitive far end crosstalk is most often the biggest component of crosstalk at the input of a receiver and is also predicable at a receiver input using appropriate circuitry. Embodiments described herein include receiver circuitry with cancellation of far end inductive/capacitive crosstalk at the receiver while limiting power and area usage in the design. Embodiments can improve the performance of devices with high speeds of data transmission while having high density of parallel channels to increase the overall bandwidth of the system and limiting usage of power and area within the design.

In various embodiments, a generation circuit is provided for generating a crosstalk cancellation voltage with limited power and area usage, while also providing buffering and amplification of the cancellation voltage. The embodiments described can also be used for any memory standard and also for any other application where it can be used. The following description and the drawings illustrate specific embodiments to enable those skilled in the art to practice them. Other embodiments can incorporate structural, logical, electrical, process, and other changes. Portions and features of some embodiments can be included in, or substituted for, those of other embodiments, and are intended to cover all available equivalents of the elements described.

Figure 1:
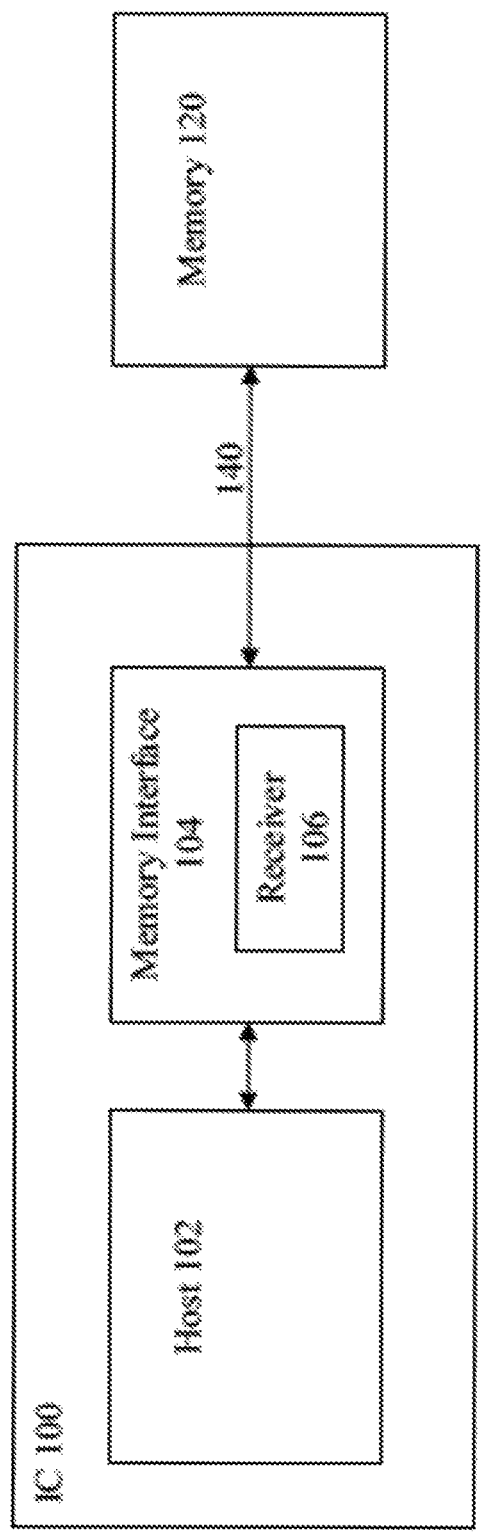
FIG. 1 illustrates an example interface between a microprocessor and a memory module, in accordance with some embodiments.

FIG. 1 illustrates the interface between a microprocessor and a memory module, in accordance with some embodiments described herein. FIG. 1 particularly shows an example interface between an integrated circuit (IC) 100 and a memory module 120, in accordance with some embodiments described herein. The memory module 120 is a dynamic random access memory (DRAM) that is connected to the IC 100 by a bus 140, which can include an address bus, a data bus, read-write (R/W) signals, and a chip-enable (CE) signal, as is known to those skilled in the art. The IC 100 is an application-specific integrated circuit (ASIC) or a system on a chip (SoC). A host 102 is a microprocessor such as a central processing unit (CPU), digital signal processor (DSP), or processor core. The memory module 120 may be controlled on a system clock and can therefore be referred to as SDRAM. Embodiments of the IC 100 can include additional components to those shown in FIG. 1, but illustration thereof is omitted herein for the sake of clarity. Single data rate (SDR) SDRAM was originally built to execute one memory read access or one write access per clock cycle. On each clock cycle, an n-bit word may be transferred to or from the memory. The word length is, in some embodiments, configured in multiples of eight, and in more recent computer machines, it is common to transfer 64-bit words per clock cycle. DDR SDRAM was implemented as an improvement over SDR SDRAM and is capable of performing two read accesses or two write accesses per clock cycle. This is accomplished by performing one access on the rising edge of the clock and one access on the falling edge of the clock. In this manner, the data transfer rate is doubled by transferring two 64-bit words per clock cycle. The standard protocols for operating DDR SDRAM are defined by JEDEC (e.g., DDR2, DDR5, GDDR6, etc.)

The operation of the host 102 involves the execution of programs that are loaded into the memory module 120 so as to create, edit, and delete data that is also stored in the memory module 120 or other devices. Specifically, each microprocessor operation involves a fetch and execute cycle where an instruction is read from the memory module 120, decoded by the host 102, and executed. Also, the execution of the instruction often involves a data read from or a data write to the memory module 120. Each of these instruction cycles is performed synchronously to a system clock, with the duration of the instruction cycle being between one or more clock cycles. In some embodiments, the duration is specifically limited to a set number of cycles between one and three clock cycles. In other embodiments, the duration may be more than three clock cycles.

More particularly, during a read operation, the host 102 indicates the address location from which data from the memory module 120 is to be read. A memory interface 104 is responsible for indicating the address on the address bus, floating the data bus (high-Z or high-impedance state), and asserting the CE and R/W signals for a read operation. Then the memory module 120 places the data from the memory location indicated by the address bus onto the data bus. The memory interface 104 then reads the data from the data bus. More particularly, a receiver 106 converts the data signals from the memory module 120 to the voltage levels needed by the host 102, and the read operation is complete. In this regard, memory types such as DDR4 typically operate between a VDDQ=1.32 Volt supply voltage down to a VDDQ=1.08 Volt supply voltage, while current microprocessor cores operate with a power supply voltage as low as VDD=0.65 Volts. The microprocessor supply voltage, core supply voltage, or signal supply voltage will be referred to herein as VDD, while the memory supply voltage or I/O supply voltage will be referred to as VDDQ.

Figure 2:
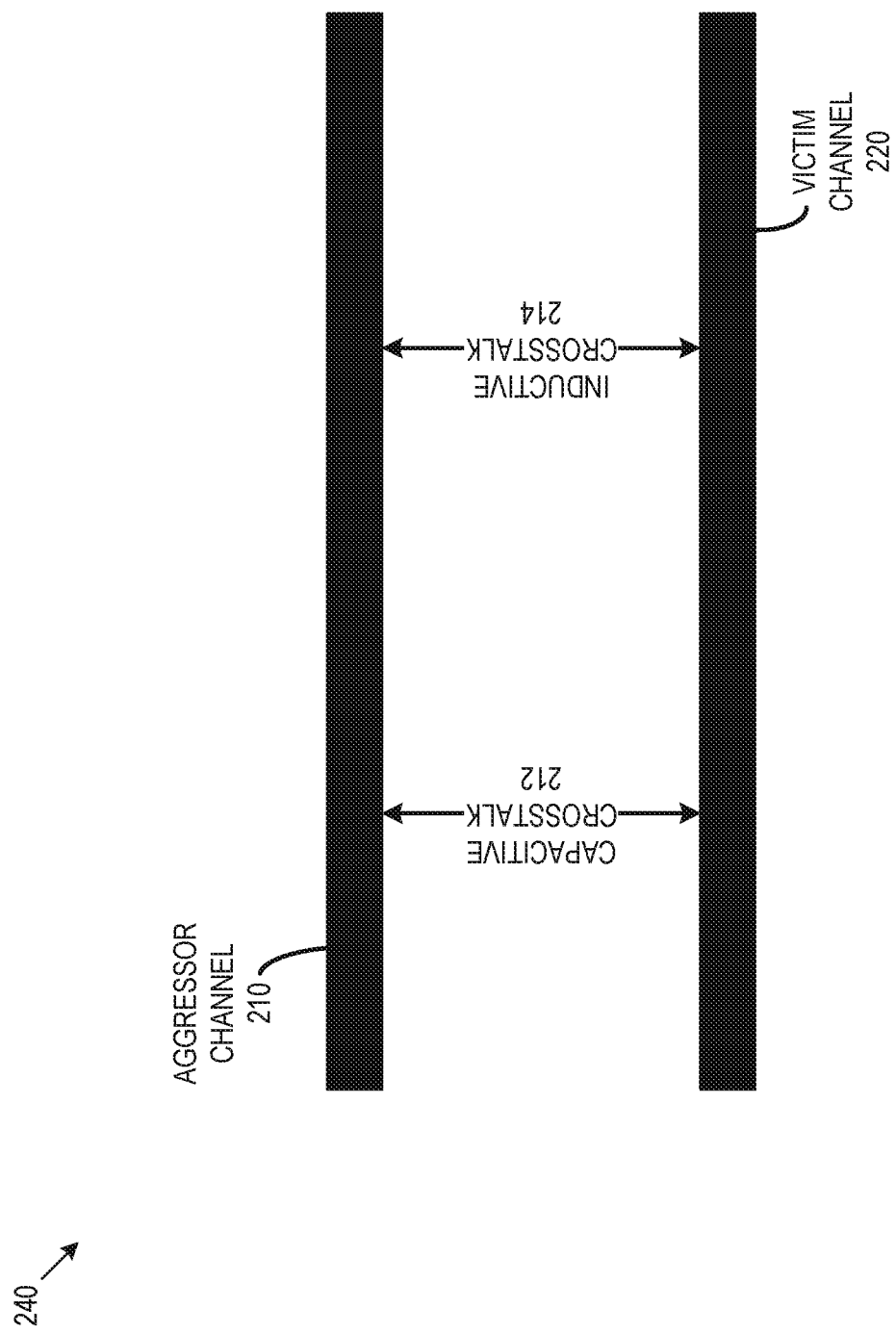
FIG. 2 illustrates aspects of channels with crosstalk, in accordance with some embodiments.
Figure 3:
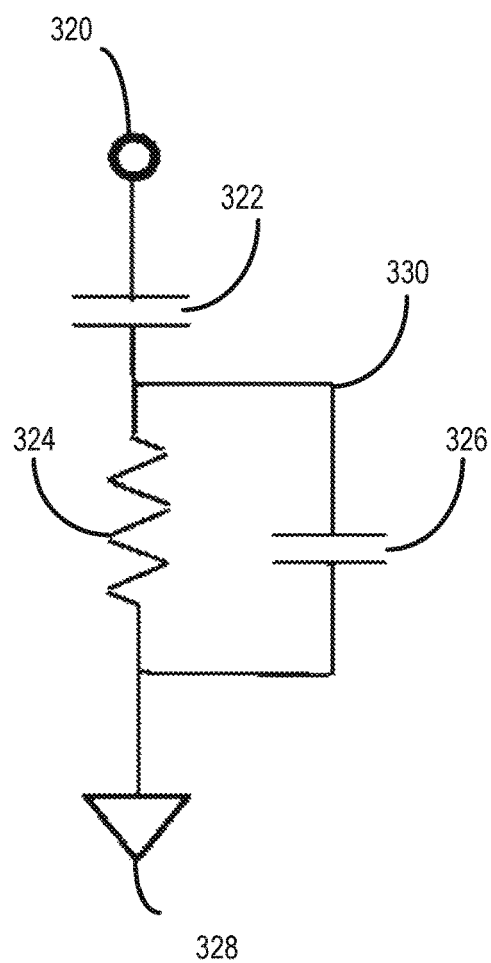
FIG. 3 illustrates aspects of a far end crosstalk model for use in generating a crosstalk cancellation signal, in accordance with some embodiments.
Figure 4:
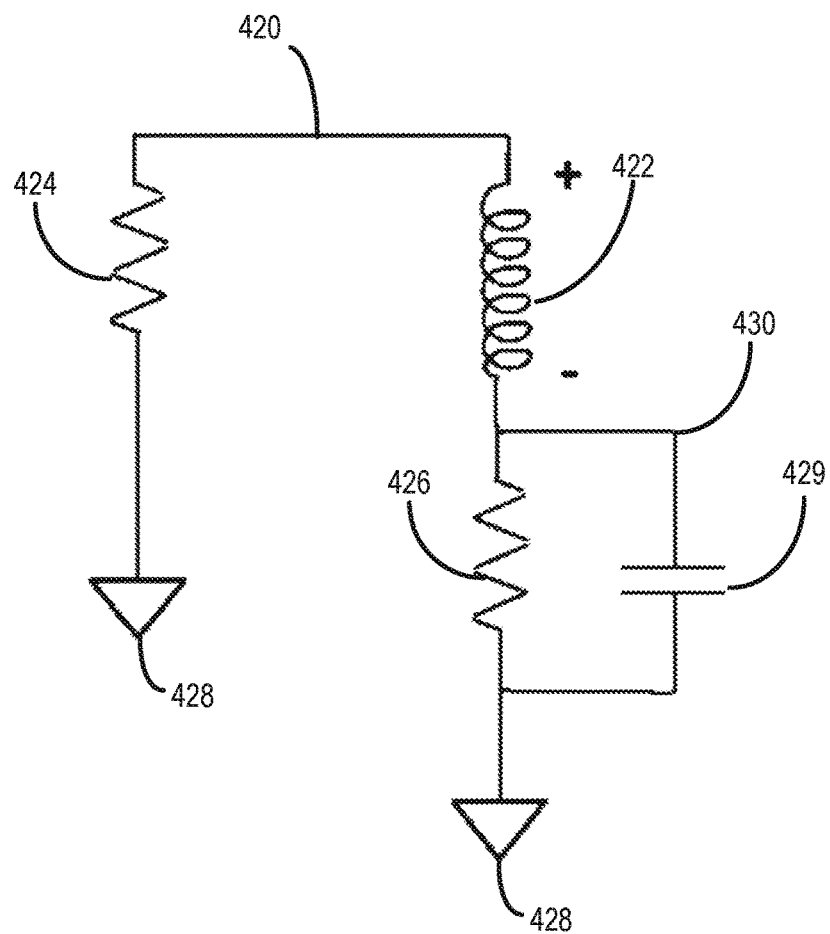
FIG. 4 illustrates aspects of a far end crosstalk model for use in generating a crosstalk cancellation signal, in accordance with some embodiments.
Figure 5:
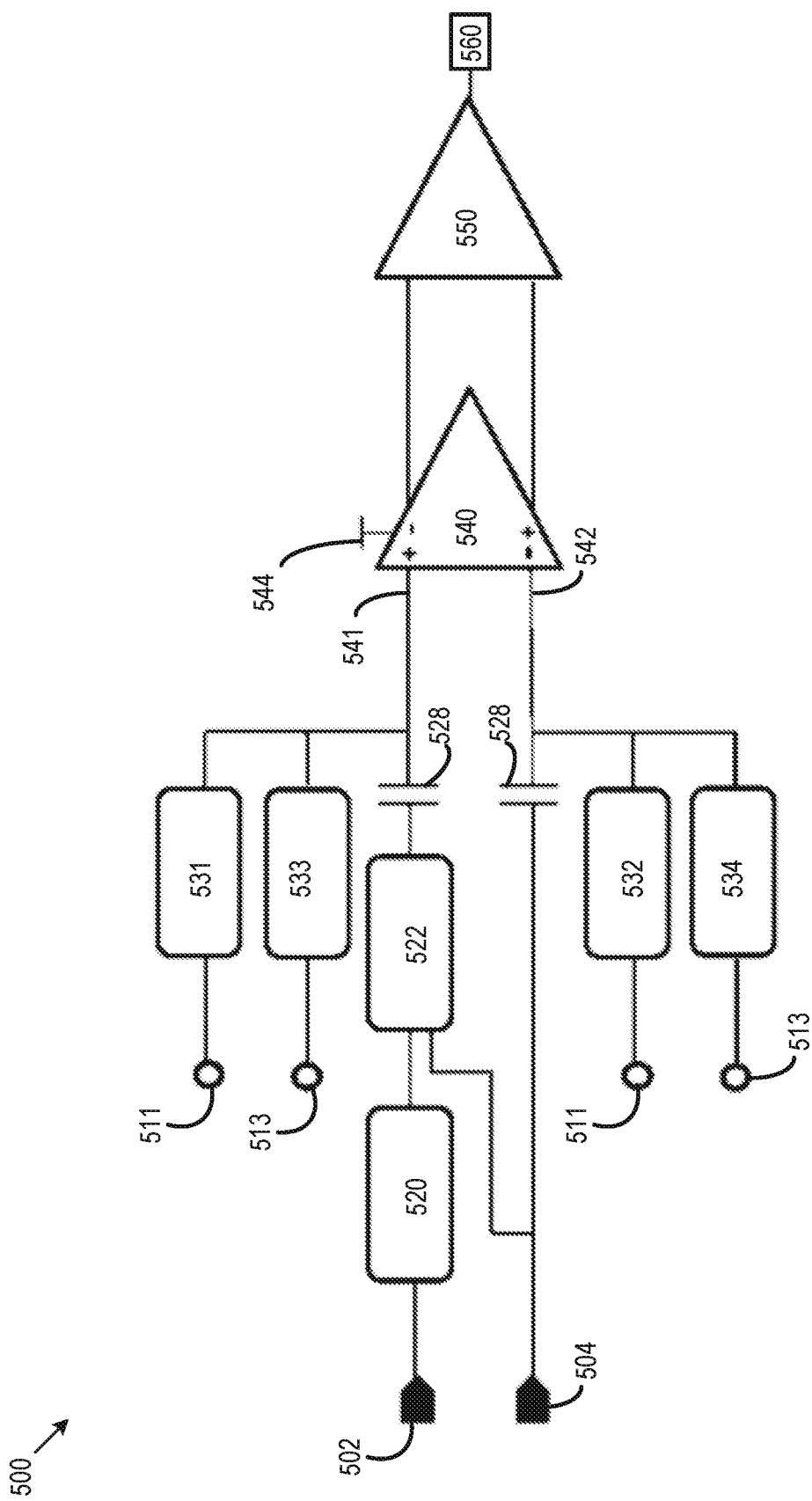
FIG. 5 illustrates aspects of crosstalk cancellation in a receiver in accordance with some embodiments.

FIGS. 2-4 illustrates aspects of channels with crosstalk, in accordance with some embodiments. In particular, FIG. 2 illustrates high speed channels 240 that can be used for memory data and a receiver as described above. FIGS. 3 and 4 describe models used for crosstalk between channels, such as channels 210 and 220 of FIG. 2. FIG. 5 then describes an embodiment of a system for crosstalk cancellation between channels such as channels 210 and 220.

As shown, system 240 of FIG. 2 includes aggressor line 210 and victim line 220. In memory systems such as DDR5, far-end crosstalk is the most dominant crosstalk. While crosstalk exists from all lines in a given group of channels, the dominant crosstalk (e.g. noise or interferences from other data lines) is from a neighboring line. As illustrated, crosstalk on channel 220 from neighboring aggressor line 210 can be modeled as capacitive crosstalk 212 and inductive crosstalk 214. Capacitive crosstalk 212 at the victim line 220 is approximately proportional to a derivative of the voltage on the aggressor line 210, and is discussed in more detail with respect to FIG. 3. Far end inductive crosstalk 214 at victim line 220 from an aggressor line 210 is approximately proportional to the negative of derivative of the voltage on the aggressor line 210, and is discussed in more detail with respect to FIG. 4. A crosstalk cancellation voltage can be generated from the aggressor line 210 voltage using a circuit that generates a voltage proportional to a derivative of the aggressor voltage. Embodiments described herein improve the circuitry of memory receivers crosstalk cancellation circuitry having an efficient balance of power, performance, and area (PPA) for the receiver. Such systems improve the timing margin for detection of data in the receiver with limited capacitive load (Ci) at the receiver PAD, while canceling crosstalk from neighboring channel(s) and maintaining the performance of the receiver, and functions for both inductive and capacitive crosstalk.

FIG. 3 illustrates aspects of crosstalk, in accordance with some embodiments. FIG. 3 shows a capacitive crosstalk model 312 which can be used in accordance with embodiments described herein. The capacitive crosstalk model 312 includes aggressor line voltage 320, coupling capacitance 322, victim line voltage 320, parallel impedance 324, pad capacitance 326, and ground 328.

For such a model 312

$$Ppole = \frac{1}{2\pi(R_{TERM}||Z_Q)(C_{PAD}+C_{COUP})} \tag{1}$$

For a typical DDR5 channel, the value of Ppole is designed to be much greater than the data rate, and so Ppole can be ignored to simplify the analysis. The crosstalk on the victim line can then be simplified to:

$$Vvictim = Vaggressor \times sCcoup(Rterm||Z0) \tag{2}$$

where Vvictim is the crosstalk victim line voltage 320 generated by the aggressor line, Vaggressor is the aggressor line voltage, Z0 is the characteristic impedance of the channel, Rterm is the receiver termination impedance, Ccoup is coupling capacitance 322, and Rterm||Z0 is the parallel combination of Z0 and Rterm which is parallel impedance 324.

FIG. 4 illustrates aspects of crosstalk, in accordance with some embodiments. Similar to FIG. 3, FIG. 4 includes inductive crosstalk model 414. Inductive crosstalk model 414 includes impedance 424, aggressor line voltage 420, inductance 422, victim voltage 430, terminal impedance 426, pad capacitance 429, and ground 428. Just as above, Ppole can be ignore for a typical DDR5 channel, and so the crosstalk from inductive crosstalk model 414 is:

$$V_{VICTIM} = -sL_M|_{AGGRESSOR}\frac{R_{TERM}}{Z_O+R_{TERM}} \tag{3}$$

which can be modified by:

$$V_{AGGRESSOR} = |_{AGGRESSOR} \times R_{TERM} \tag{4}$$

resulting in:

$$V_{VICTIM} = -sL_M V_{AGGRESSOR}\frac{R_{TERM}}{Z_O+R_{TERM}} \tag{5}$$

where Vvictim is the crosstalk victim line voltage 430 generated by the aggressor line, Vaggressor is aggressor line voltage 420, s represents frequency in a Laplace domain, Iaggressor is the current through inductance 422, Lm is inductance 422, Rterm is receiver termination impedance 426, Z0 is impedance 424. Just as above, Z0 is the characteristic impedance of the channel.

The two Vvictim crosstalk values generated at the victim line by the aggressor line can then be combined to generate a cancellation voltage which is the opposite of the combined crosstalk voltage generated at the victim line by the aggressor line.

Figure 6A:
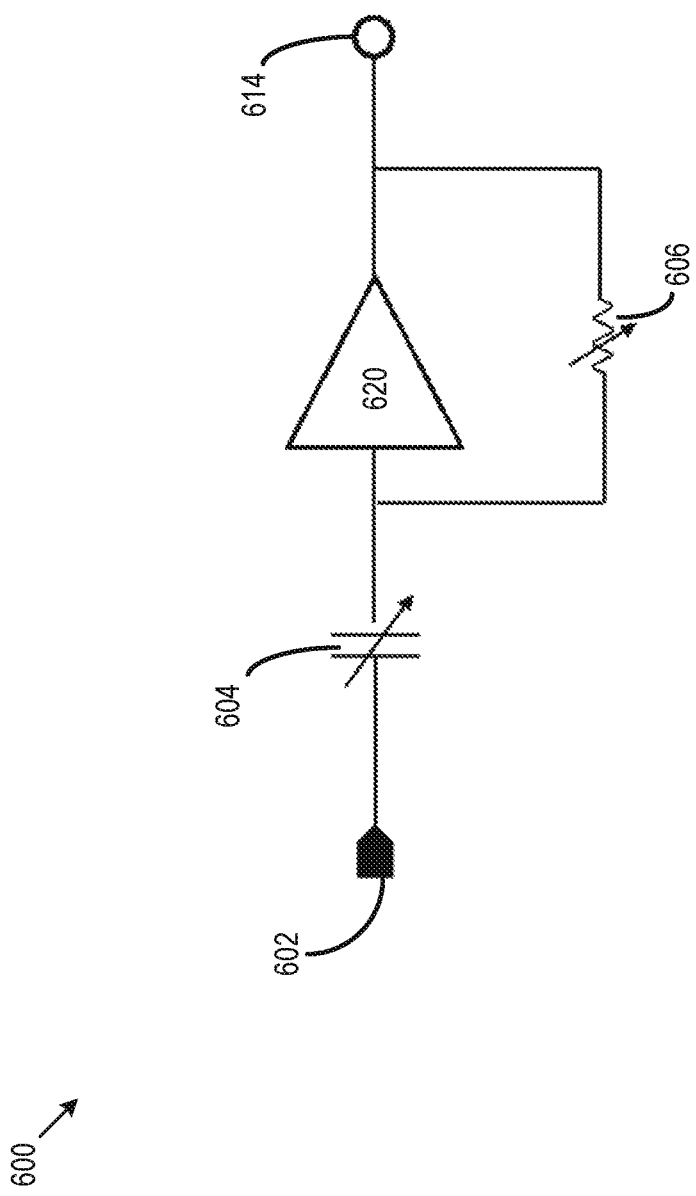
FIG. 6A illustrates aspects of crosstalk cancellation in a receiver in accordance with some embodiments.
Figure 6B:
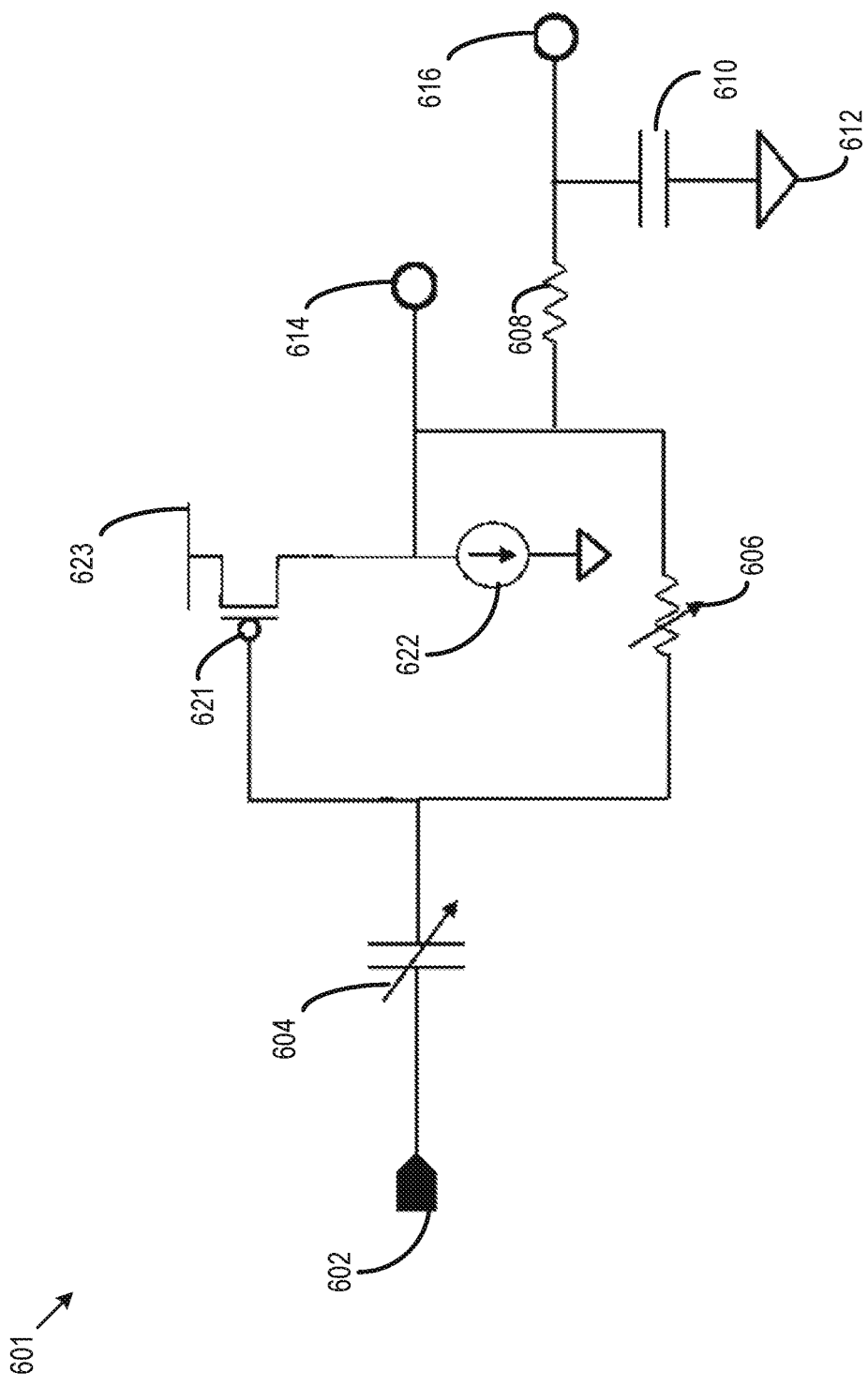
FIG. 6B illustrates aspects of crosstalk cancellation in a receiver in accordance with some embodiments.
Figure 8:
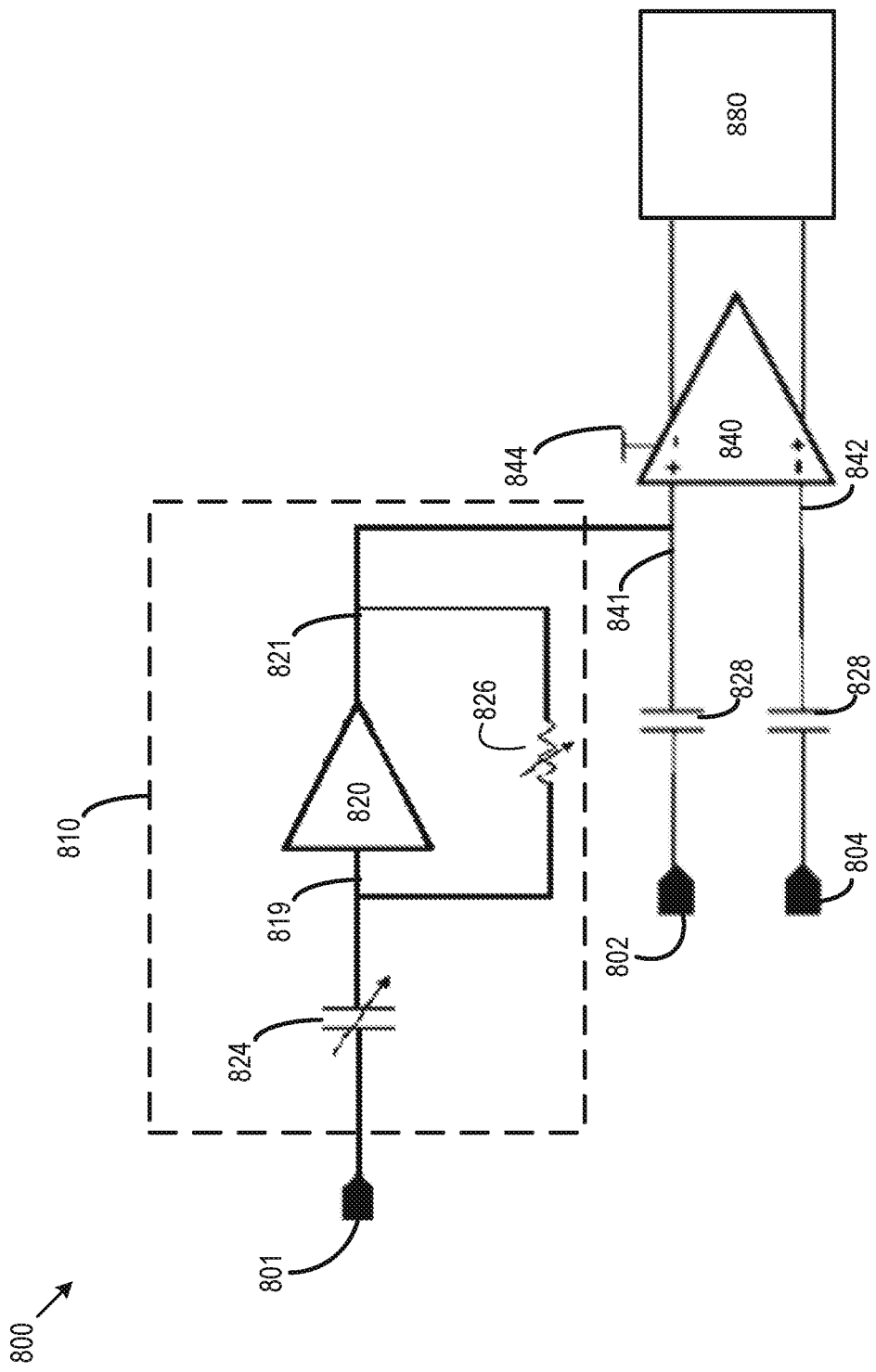
FIG. 8 illustrates aspects of crosstalk cancellation in a receiver in accordance with some embodiments.
Figure 9:
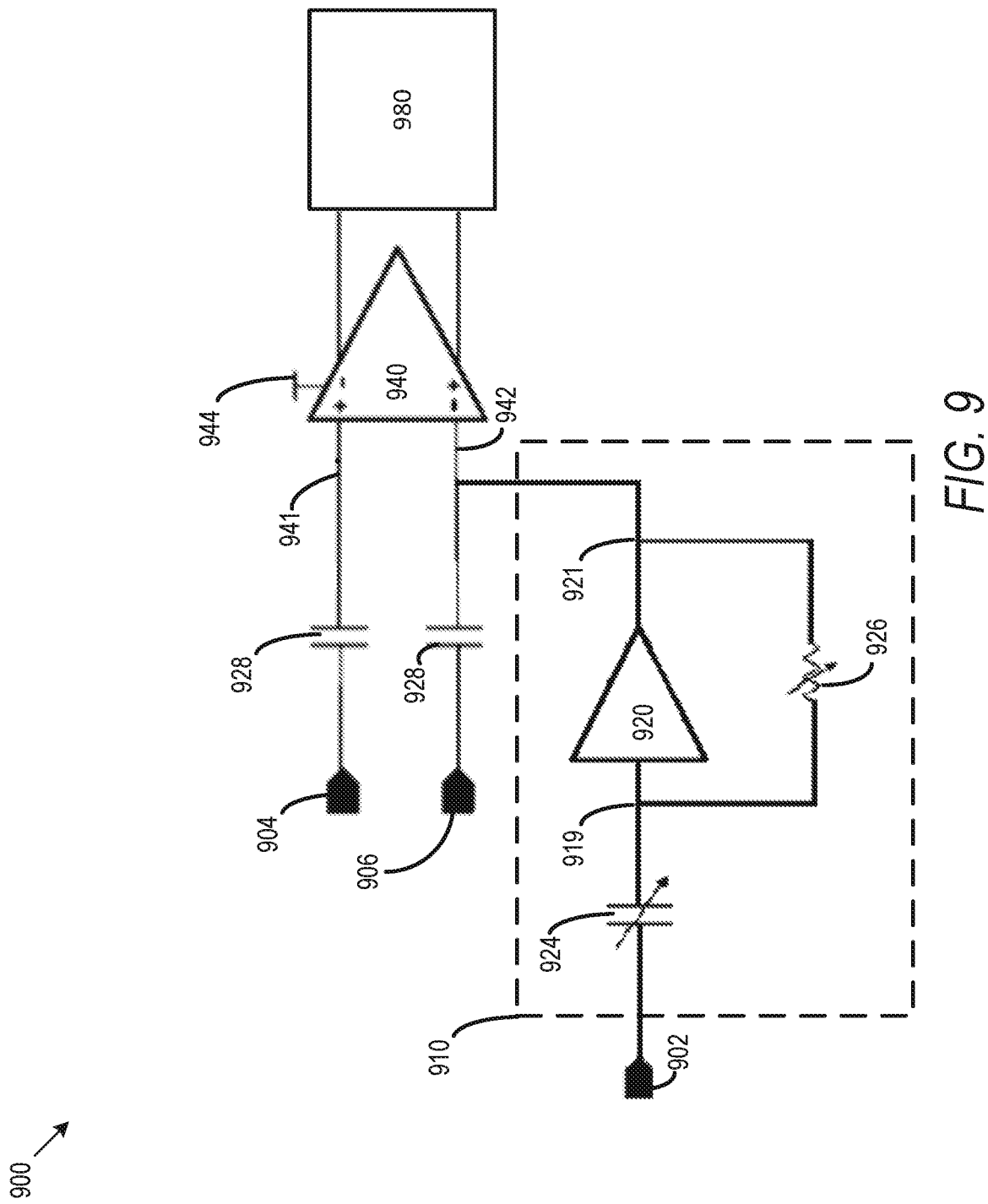
FIG. 9 illustrates aspects of crosstalk cancellation in a receiver in accordance with some embodiments.

The following example embodiments can then use the details of the above far end crosstalk models to determine the values of the circuit elements in buffering circuitry used to generate a crosstalk cancellation signal (e.g. resistor and capacitor values that set the cancellation signal generated from an aggressor line). FIG. 5 illustrates an example with two buffer circuits for two aggressor lines, and switching circuitry to select which amplifier input receives the cancellation signal (e.g. the negative side amplifier reference input or the positive side amplifier signal input) as well as operating with autozeroing (e.g. calibration) functionality for the receiver system. FIGS. 6A and 6B illustrate two examples of buffering circuitry (e.g. crosstalk cancellation generation circuitry) used to generate a crosstalk cancellation signal from an aggressor line. FIGS. 8 and 9 illustrate examples with a buffer signal coupled to a single side of the receiver amplifier without the above switching circuitry.

FIG. 5 then illustrates aspects of crosstalk cancellation in a receiver as circuitry 500 in accordance with some embodiments. Circuitry 500 is configured to accept crosstalk inputs includes coupling circuits 531-534, clamp 520, switch 522, input capacitors 528, amplifier 540 with voltage (V) Vdd 544, amplifier inputs 541 and 542, differential-to-single ended conversion (Dif-to-SE) circuitry 550, reference voltage (Vref) 504, input voltage (Vpad) 502, crosstalk cancellation inputs 511 and 513, and output 560. The crosstalk cancellation inputs provide crosstalk cancellation signal from buffer circuitry. Generation of crosstalk cancellation voltages provided to crosstalk cancellation inputs 511 and 513 along with coupling circuit 531-534 are described in more detail below with respect to FIGS. 6 and 7. While each crosstalk cancellation inputs 511 and 513 are inputs from a respective aggressor line into coupling circuitry for either the positive or negative amplifier inputs 541 and 542, as in the embodiment of FIG. 5 an aggressor line is connectible to both amplifier inputs via a switch in the corresponding coupling circuit 531-534 as described in more detail below. For example, a first crosstalk cancellation voltage provided to crosstalk cancellation input 511 can be coupled to either amplifier input 541 via a switch in coupling circuit 531 or amplifier input 542 via switching in coupling circuit 532 (e.g. with the switch in coupling circuit 531 open/disconnected when the switch in coupling circuit 532 is closed/connected). This essentially allows the cancellation signal to be subtracted from the data signal received via input 502, either by direct modification of the data signal, or by modification of the reference signal received via reference 504 and used to amplify the data signal at amplifier 540.

In circuitry 500, buffered input voltages (e.g. at crosstalk cancellation inputs 511 and 513) are used for each corresponding aggressor line. Circuitry 500 illustrates circuitry for cancellation of crosstalk from two aggressor lines, but it will be apparent that similar circuitry can be used for cancelling crosstalk from any number of aggressor lines. Additional details of the mechanisms of cancellation using circuitry 500 and similar circuitry of other embodiments is also described below following examples of coupling circuitry 531 and 533 and details of an example for buffered input voltage generation. Circuitry 500 can be considered an input part of a receiver structure. This input circuitry has single ended output 560 and a differential input, which is dealt with through circuitry 550. In a differential receiver, circuitry 550 would be replaced with other appropriate circuitry to condition the signal for output 560.

Further, in circuitry 500, a buffered input voltage from crosstalk cancellation input 511 is for a first aggressor line, and a buffered input voltages from crosstalk cancellation input 513 is for a second aggressor line. As mentioned above, other embodiments can have buffered input voltages from any number of aggressor lines via associated buffer (e.g. crosstalk cancellation) circuitry. The input 502 provides the victim line receiver input voltage and the reference voltage 504 is the reference voltage for comparison at the receiver. The buffered input voltages (e.g. cancellation voltages) are combined either at the positive node of input 541 of amplifier 540 or at the negative node of input 542 of amplifier 540. In some embodiments, the positive input can be selected for primarily capacitive far end crosstalk, and the negative input can be selected for primarily inductive far end crosstalk. In other embodiments, a single input can be used for the crosstalk cancellation, or different aggressor lines can have their crosstalk canceled at different inputs of amplifier 540. For example, one embodiment can have a first and second aggressor line coupled to a positive amplifier input via first and second buffer circuits that generate appropriate crosstalk cancellation signals, and a third, fourth, and fifth aggressor lines can be coupled to the negative amplifier input via separate corresponding buffer circuitry for each line. This can provide far end crosstalk cancellation for any number of aggressor lines depending on the circuit design.

Switch 522 is used for connecting the reference voltage 504 to the receiver for autozeroing operations. Such switches can be used specifically with a receiver having autozero functionality. Some embodiments of crosstalk cancellation circuitry in accordance with the present application can be configured to not use autozeroing or switch 522.

In autozeroing operations mode, an offset of each receiver arrangement (e.g., sub-receiver in a multiple receiver arrangement) is stored in its respective input capacitor. The capacitor decouples the input common mode from the receiver amplifier common mode. In this way, the input common mode can be at a high voltage (e.g., near VDDQ or VDD), while the amplifier can run at a different voltage (e.g., a lower voltage or a voltage near ground). Periodic repetition of the autozeroing operation for each receiver element prevents drift during operation of the receiver.

The above elements for crosstalk cancellation can then be used for various AC coupled receivers. Because far end crosstalk is the dominant crosstalk in DDR channels relevant to the embodiments described herein, far end capacitive and inductive crosstalk is described above resulting in equations 2 and 5, and the circuitry for cancelling such crosstalk is described.

FIGS. 6A and 6B illustrate aspects of crosstalk cancellation in a receiver related to generation of buffered input voltages used to create crosstalk cancellation such as buffered input voltages at crosstalk cancellation inputs 511 and 513. Circuitry 600 is one implementation of a circuit for generation of a buffered input voltage for crosstalk cancellation, which includes a generic amplifier as crosstalk amplifier 620. Circuitry 601 is a version of circuitry 600 with a specific design for amplification and an optional filter.

Circuitry 600 includes voltage pad 602, crosstalk capacitor 604, crosstalk amplifier 620, crosstalk resistance 606, and output 614.

Circuitry 601 of FIG. 6B then includes voltage pad 602, crosstalk capacitor 604, crosstalk resistor 606, and output 614, just as described above for circuitry 600. Circuitry 601, however, includes transistor 621 and current source 622 as an implementation of crosstalk amplifier 620. Additionally, filter resistor 608 and filter capacitor 610 are coupled to ground 612 to create the optional circuitry for generation of a filtered voltage output 616, which can be used to derive a direct current bias point of the output of the amplifier in any version of circuitry 600, such as circuitry 601.

In the case of either inductive crosstalk, capacitive crosstalk, or both, the crosstalk as modeled in equations 2 and 5 above can be rewritten in the form:

$$V_{CANCELLATION} = V_{AGGRESSOR} s C_{CRSTLKR} C_{RSTLK} \quad (6)$$

Circuitry 600 and 601 both implement equation 601 such that input voltage pad 602 is given aggressor line voltage Vaggressor, crosstalk capacitor 604 is the value of Ccrstlk, crosstalk resistor 606 is set to the value of Rcrstlk, and the value of s represents frequency in a Laplace domain. In circuitry 600, crosstalk resistor 606 connects output 614 of a high negative gain crosstalk amplifier 620 to the crosstalk amplifier input of crosstalk amplifier 620 in negative feedback. The crosstalk amplifier input to crosstalk amplifier 620 thus acts as a virtual ground or an AC ground voltage with small movement. Similarly, in circuitry 602 the p-type metal oxide semiconductor (PMOS) transistor with current source 622 provide a specific implementation of such a high negative gain amplifier with a virtual ground. In various embodiments, crosstalk capacitor 604 and crosstalk resistor 606 are programmable and can be adjusted to tune a strength of crosstalk cancellation voltage to improve crosstalk cancellation performance.

FIG. 7 illustrates aspects of coupling circuitry 700 for crosstalk cancellation in a receiver in accordance with some embodiments. Coupling circuitry 700 is configured for use with filtering circuitry shown in FIG. 6B as part of circuitry 601. Coupling circuitry 700 includes input pad 702, switches 704 and 705 filtered input pad 712, coupling capacitor 706, and output 710. Such a coupling circuit can be used for each instance of coupling circuits 531-534 in FIG. 5. When a cancellation signal is generated (e.g. via circuitry 600 or 601 as described above) to be combined with a receiver input for crosstalk cancellation, switch 704 is closed (e.g. enabled) and switch 705 is open (e.g. disabled). When a cancellation voltage (e.g. an input buffer voltage) associated with a particular coupling circuit 700 is to be disconnected, switch 705 is closed and switch 704 is open. This results in coupling capacitor 706 being attached to a filtered voltage output (e.g. filtered voltage output 616). This filtered voltage output provided to coupling capacitor 706 approximately generates the direct current (DC) value of the crosstalk signals (e.g. the buffered input signals 511-514). These values are provided to the inputs of the amplifier 540 during disabled modes or during autozero operations of an autozero receiver. Such a switching with the DC value of the crosstalk signals can be excluded when the receiver does not include a disabled or autozero function. In such cases, the coupling circuits (e.g. coupling circuits 531-534) can simply be capacitors or acceptable coupling paths.

The above architecture embodiments illustrate crosstalk cancellation circuitry for input to receiving circuitry configured for receiving one bit of data from memory as part of a datastream and can be replicated based on the word size used in a particular application. It will be apparent that additional circuitry will be present as part of the receiving circuitry to accept and process the bits of the data stream as part of a receiver for a memory interface circuit (e.g., memory controller and/or physical layer (PHY)). Such additional elements can include differential autozeroing receiver (DAZR) functionality as part of a JEDEC-compliant memory receiver in various embodiments. Such crosstalk cancellation circuitry can be used with receiver circuitry as described above, including receiver architectures which are not necessarily limited to a memory interface circuit on a separate chip or die from a memory chip or die. For example, the receiver architecture including embodiments of crosstalk cancellation circuitry described herein could be placed on a memory die and be connected to a memory controller PHY.

In general, the receiver circuitry coupled to crosstalk cancellation circuitry provides an amplified output at an output terminal based on the data provided from a memory at the input terminal. The data at the input terminal can be the output of an amplifier in crosstalk cancellation circuitry as described above. A voltage provided at a voltage reference terminal is a reference voltage that is used for detecting whether a data bit received at the input terminal 502 is a logic "1" or a "0" and effectively represents the input common mode level of the circuit. In one example embodiment, the reference voltage is generated on the integrated circuit and is configurable. In some embodiments, the reference voltage (or voltages for multiple voltage reference terminals) may be adjusted as part of decision feedback equalization (DFE) to reduce errors in determining whether the input bit is a logic "1" or "0." Such a receiver can, in some embodiments, include duplicate receiver paths for DFE and autozeroing (e.g. calibration) operations.

In some embodiments, an output from receiver circuitry attached to crosstalk cancellation circuitry is an output of a multiplexer (Mux). Such a multiplexer can output a CMOS-level signal which is input to a flip-flop which is clocked by a strobe signal. Selection of data by the Mux after a sampler (e.g. as sampled from signal 502 received and amplified by the receiver circuitry 500 to output 560 as described above) avoids timing errors in the critical eye window: Samplers in each receiver path can have associated dead bands or timing errors. This may be handled by having sufficient eye height at the differential amplifier output for each receiver arrangement. In still further embodiments, the deadband of each sampler is compensated for or reduced by having offset controls in each sampler and calibrating them during device initialization.

As described above, receiver paths can have an operating (e.g. amplifying mode) and a calibration (e.g. autozero) mode, controlled by switches, including switches in the crosstalk calibration circuitry. During transitions from amplifying to autozero operation, individual receiver arrangements may not provide data at the output of the arrangement, and so the periodic cycle of autozeroing and amplifying for each arrangement may be structured to ensure that one receiver arrangement is always in a consistent amplifying mode. In one embodiment, each bit is on an approximately 55-picosecond (ps) cycle, and the receiver arrangements autozero on a 10-nanosecond (ns) cycle, such that each receiver arrangement enters an autozero mode every 10 nanoseconds, or roughly once every 180 bits.

In various embodiments, any number of receiver arrangements may be included in a single receiver embodiment, with a Mux to select between the receiver arrangements. This allows not only for selection of a receiver arrangement that is not operating in an autozero mode, but also for selection of a receiver arrangement with DFE settings to reduce bit decision errors. For example, each arrangement can have programmable resistors or capacitors which are used to modify the receiver arrangement operation, and analysis of recent bit decisions may be used to select data from a receiver arrangement based on the settings of the programmable elements (e.g., capacitors or resistors). As part of such calibration, crosstalk cancellation capacitors and resistors can also be calibrated in some embodiments. Similarly, in some embodiments, each receiver arrangement, including associated crosstalk cancellation circuitry, can be attached to a differential voltage reference terminal (e.g., instead of a single voltage reference terminal). In addition to cycling through receiver arrangements for autozero operations, for receivers with more than two receiver arrangements, control circuitry may select between the receiver arrangements that are not in autozero operations based on DFE considerations of different reference voltages of the different receiver arrangements, or based on DFE considerations of different settings of programmable elements. Thus, in some embodiments, a reference voltage may be set based on DFE sensing of previous bits, and a particular receiver arrangement with a programmed reference voltage selected as part of DFE operations.

Receiver devices operate as part of a system memory to achieve higher bandwidth per pin for applications such as data servers, artificial intelligence, high-speed graphics, machine learning, or other such applications by meeting JEDEC GDDR6 protocols in memory applications with speeds up to 18 gigabits per second (Gbps). In some embodiments, memory applications supported may be higher than 18 Gbps. These standards may be met by system on a chip (SOC) physical layer (PHY) designs using the receiver with appropriate circuit elements designs, including crosstalk cancellation circuitry as described above. Additionally, the JEDEC GDDR6 protocols do not have provision for periodic calibration or live data calibration updates because there is no guarantee of read activity or transitions, and thus have tight drift specifications to be met by the receiver. Further, GDDR6 protocols use signaling at or near power voltages, and thus compatible receiver designs are capable of receiving high-voltage (e.g., near the power voltage) signals at the input. The specifications of JEDEC GDDR6 thus call for a high-speed low-voltage and temperature (VT) drift receiver with low power and good timing margins. Such VT constraints can be met using the autozero operations integrated with receiver circuitry and crosstalk cancellation circuitry described above.

To meet the operating standards of GDDR6, embodiments described herein may use low-voltage cascaded differential amplifiers in receiver paths following the crosstalk cancellation circuitry, with bandwidth enhanced by introducing zeros in the transfer function. In some embodiments, the amplifier in the receiver is built from cascaded resistive load stages, with the first stage having continuous time linear equalization (CTLE) for channel response, and one or more subsequent stages having a source degenerated impedance to introduce zero in the transfer function and enhance the bandwidth. The number of stages in the multi-stage differential amplifiers for each receiver arrangement depends on the technology node (e.g., 7 nm, 10 nm, etc.), with higher technology nodes needing more stages. In some embodiments with two or three stages, Miller compensation is used to keep the amplifier stable in autozero mode, with Miller capacitors connected during the autozero mode and disconnected during the amplifying mode. In some embodiments with three or more stages, nested Miller compensation may be used. Some embodiments may operate with one receiver arrangement operating as a parallel calibration receiver which is swapped periodically with the main receiver and the DFE unrolled tap receivers. A level-shifting capacitor is used in some embodiments to handle the down-level shifting of high-voltage input signals to low-voltage outputs using receiver input capacitors. Such capacitors may also be used to autozero the differential amplifier and store an offset during the autozero phase. Within each amplifier, one or more Miller compensation capacitors may be connected with switches during the autozero phase to keep the amplifier loop stable, and nested Miller compensation capacitors may be connected when three or more stages are used for a multi-stage differential amplifier.

In some embodiments, for basic receiver operation, the receiver arrangements alternate between an autozero mode and an amplifying mode. During the amplifying mode, all odd and even or IQ data is connected through the amplifying receiver arrangement. During autozero mode, the data is not passed through a receiver arrangement, and the receiver relies on another receiver arrangement. A Mux accepts the outputs of all receiver arrangements, and selects the output with data (e.g., from the receiver arrangement in amplifying mode). Since selection of data between the different receiver arrangements happens after the input data has been sampled once, the error introduced at the sampler by switching between receivers does not affect the timing margin. When unrolled DFE is implemented with one or more taps, the extra receivers are swapped one by one into autozero mode to prevent VT drift. In some embodiments, programmable elements in an input stage of an amplifier may be set for DFE.

In one embodiment, the output 614 would be connected to either a positive or negative input of an amplifier dependent on the configuration of switches in coupling circuitry. For example, in an embodiment with the buffer circuitry from FIG. 6A, the coupling circuitry from FIG. 7, and the circuitry from FIG. 5 switches 704 and 705 determine whether the output 614 is coupled to a positive input 541 or negative input 542 of amplifier 540. If the output 614 is to be coupled to positive input 541 via input 513, then switch 704 of the instance of coupling circuitry 533 is on, switch 705 of coupling circuitry 533 is off, switch 704 of coupling circuitry 532 is off, and switch 705 of 532 is on. If the output 614 is to be coupled to negative input 542, then switch 704 of circuit 533 is off, switch 705 of circuit 533 is on, switch 704 of circuit 534 is on, and switch 705 of circuit 534 is off. When the coupling circuit 532 is connected through switch 704, the crosstalk cancellation signal from the buffer circuitry is coupled. When the coupling circuit is connected through switch 705, then a DC filter value 616 is coupled which will not couple crosstalk signal and will just act as a DC bias and AC ground. During autozero operations, switches 704 of coupling circuits 531-534 are off to disconnect the inputs 511 and 513, and switches 705 of coupling circuits 531-534 are on. Switch 522 is configured as described above to calibrate the inputs and prevent drift. In some embodiments, for each victim line, a system channel response is analyzed to determine the far end crosstalk (e.g. whether it is primarily inductive or capacitive), and the configuration of the buffer circuit and connection circuit can be set based on the analysis of the system channel response.

In various embodiments, aspects of the circuitry are implemented differently, including structures with a digital signal processor, a programmable logic device, a field-programmable gate array, a microprocessor, a microcontroller, or a digital application-specific integrated circuit (ASIC). In some embodiments, by using a relatively small second-order RC structure for zeros at the input and a zero using the DFE cap, the proposed architecture saves layout area that would have been spent on large frequency enhancement capacitances in amplifier stages and programmable resistive DACs for DFE offsets.

FIG. 8 illustrates aspects of crosstalk cancellation in a receiver in accordance with some embodiments. FIG. 8 shows receiver circuitry 800 including crosstalk aggressor line connection 801, crosstalk victim line connection 802, reference voltage connection 804, buffering circuit 810, coupling circuit 890, amplifier 840, and output 880. Circuitry 800 can be circuitry for a receiver apparatus of a memory device such as receiver 106 of FIG. 1, to enable memory operations between host 102 and memory 120. As part of such circuitry 800, at least two lines are configured for communications between the receiver circuitry and memory. As described above, these lines can create crosstalk during communications between the receiver circuitry and memory, and buffering circuit 810 generates a crosstalk cancellation signal from an aggressor line connected to crosstalk aggressor line connection 801 for another line connected to crosstalk victim line connection 802. Amplifier 840 receives power from voltage connection 844 (e.g. Vdd). Amplifier 840 also includes a second amplifier input 842 connected to reference voltage connection 804 and a first amplifier input 841 coupled to the crosstalk victim line via crosstalk victim line connection 802. This first amplifier input 841 accepts the data signal on the victim line for amplification. Both the data signal and a reference voltage can be provided to amplifier 840 via an input capacitors 828 as shown. The data signal from the victim line, however, includes crosstalk interference from the aggressor line, which is compensated for by buffering circuit 810. Buffering circuit 810 includes crosstalk amplifier 820, crosstalk capacitor 824 coupled between the crosstalk aggressor line connection 801 and a crosstalk amplifier input 819 of the crosstalk amplifier 820. Buffering circuit 810 also includes a crosstalk resistor 826 coupled between a crosstalk amplifier output 821 of the crosstalk amplifier 820 and the crosstalk amplifier input 819. The values of the crosstalk resistor 826 and the crosstalk capacitor 824 can be determined as described above according to the far end crosstalk models. The crosstalk amplifier output 821 is connected to the first amplifier input 841 via coupling circuit 890 essentially remove the crosstalk cancellation signal from the data signal on the victim line to improve signal quality and performance of the memory system. In some embodiments, coupling circuit 890 can be embodied as coupling circuitry 700. In other embodiments, other similar coupling circuitry can be used to provide a connection as shown. As described above, in some embodiments, a crosstalk amplifier output such as crosstalk amplifier output 821 can be connected to both inputs of the amplifier 840 via coupling circuits including switches. In other embodiments, such as that of FIG. 8, an aggressor line can have crosstalk on a victim line compensated where the buffer circuit is only coupled to one of the inputs of the amplifier. Since modifying either the data signal or the reference signal can have the impact of subtracting the crosstalk signal generated by the buffer circuit 810 from the data signal, either inputs can be used in different embodiments. In other embodiments, an option to include connections to both can be used both to provide flexible operations for crosstalk cancellation, as well as to assist with autozero operations in embodiments including such functionality.

FIG. 9 then illustrates additional aspects of crosstalk cancellation in a receiver in accordance with some embodiments. In particular. FIG. 9 illustrates an embodiment of circuitry 900 with the buffer circuit output connected to the reference voltage input of the amplifier 940. Circuitry 900 is part of a memory interface system which, as described in FIG. 1 above, includes receiver circuitry configured for data communications between a memory and a host such as memory 120 and host 102 using at least two lines (e.g. lines for data channels of bus 140), which interfere with each other. For purposes of a single buffer circuit, one is considered a crosstalk victim line and the other a crosstalk aggressor line, though lines can be both victim and aggressor for each other, with corresponding buffer circuits providing crosstalk cancellation signals in both directions. Circuitry 900 is similar to circuitry 800, but with the crosstalk amplifier output 921 coupled via coupling circuit 990 to the second amplifier input 942 and the reference voltage via reference voltage connection 906, rather than to the first amplifier input 941. In some embodiments, coupling circuit 990 can be embodied as coupling circuitry 700. In other embodiments, other similar coupling circuitry can be used to provide a connection as shown. As mentioned above, by modulating the reference voltage, the same impact of removing the crosstalk can be seen at the output of amplifier 940 as would be seen by modifying the data signal and first amplifier input 941 directly. In some embodiments, improved performance can be seen by modifying the reference signal or the data signal at respective inputs 941 or 942 (e.g. based on whether the crosstalk is primarily capacitive or inductive). Circuitry 900 implements crosstalk cancellation in a receiver with amplifier 940 comprising an amplifier output 980, a first amplifier input 941 coupled to the crosstalk victim line via crosstalk victim line connection 904, a second amplifier input 942 coupled to a reference voltage via reference voltage connection 906 and coupling circuit 990. Both inputs 941 and 942 are shown as connected via input capacitors 928. Circuitry 900 also includes the buffer circuit 910 comprising a crosstalk amplifier 920, a crosstalk capacitor 924 coupled between the crosstalk aggressor line via crosstalk aggressor line connection 902 and a crosstalk amplifier input 919 of the crosstalk amplifier 920. Buffer circuitry 910 also includes crosstalk resistor 926 coupled between a crosstalk amplifier output 921 and the crosstalk amplifier input 919. As described above, the crosstalk amplifier output 921 (e.g. the buffer circuit output with the crosstalk cancellation signal) is coupled to the second amplifier input 942 via coupling circuit 990.

As described above, while circuitry includes only a connection via coupling circuit 990 from the crosstalk amplifier output 921 to one of the inputs to amplifier 940, other embodiments can use switching to enable connections to either input, with the crosstalk cancellation signal removed from the victim line data signal from either input of amplifier 940.

Any apparatus described herein may be modeled and simulated using EDA tools. Some embodiments, then, rather than being physical circuits, are non-transitory computer-readable media comprising instructions that, when executed by one or more processors of a computing device, cause the computing device to generate a circuit design by configuring the computing device to perform operations comprising configuring circuit elements within a model circuit design file as part of a circuit design. Such circuit design files are further used to model operation in accordance with some embodiments.

Figure 10:
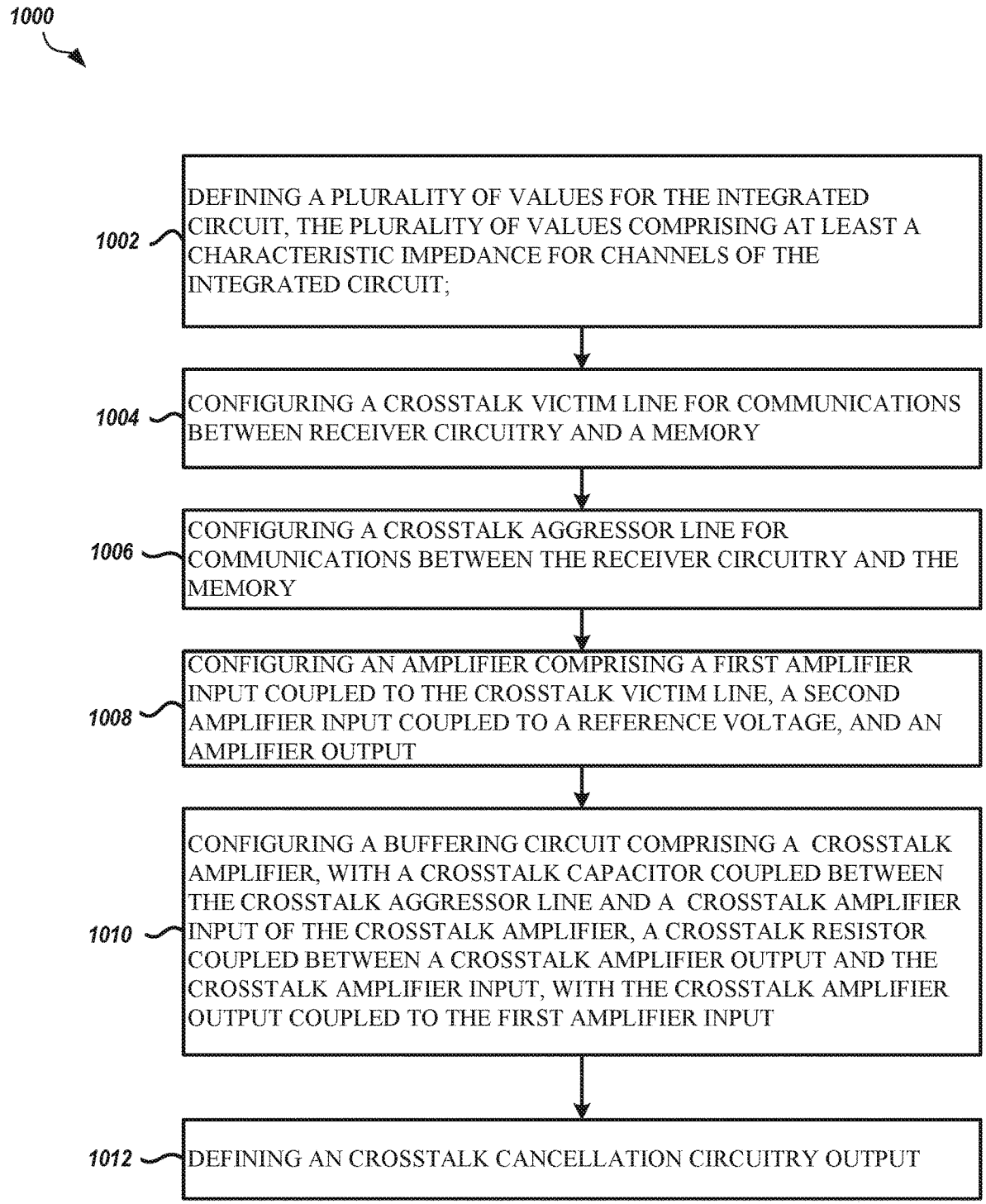
FIG. 10 illustrates an example method in accordance with some embodiments.

FIG. 10 illustrates an example method in accordance with some embodiments. In particular, FIG. 10 illustrates aspects of an example method for generating crosstalk cancellation circuitry for a receiver in accordance with some embodiments. In some embodiments, method 1000 of FIG. 10 may be performed by a machine or an EDA computing device, using automation and/or inputs received at the system to generate a component arrangement within EDA software which may then be used to fabricate or initiate fabrication of an integrated circuit. In some embodiments, method 1000 may be embodied by instructions stored in a storage medium or in a non-transitory storage device which, when executed by one or more processors of a machine (e.g. an EDA computing device), cause the machine to perform the operations of method 1000.

Method 1000 can be considered a method of configuring a component arrangement in design (e.g. using an EDA tool) for an integrated circuit, and begins with operation 1002 involving defining a plurality of values for the integrated circuit, the plurality of values comprising at least a characteristic impedance for channels of the integrated circuit. This can also involve defining parameters for available amplifiers, circuit element tolerances (e.g. for capacitive and resistive elements), initial values for any of the elements of the equations above, or any other such inputs for a circuit design. Operation 1004 involves configuring a crosstalk victim line for communications between receiver circuitry and a memory, and operation 1006 involves configuring a crosstalk aggressor line for communications between the receiver circuitry and the memory. In some embodiments, multiple aggressor lines are configured for each victim line, or different victim lines can have different associated aggressor lines. Such lines (e.g. channels for communication between a host and memory) may not be defined as victim and aggressor as they are configured, but identified as such during a later stage of the design flow which identify a need for crosstalk cancellation due to design performance. In some embodiments, a victim line can be an aggressor line with respect to another line, and so as new lines are added to a design, previously configured lines can be identified as an aggressor line for a newly added line, or lines can be identified as both victim and aggressor during a design flow, with the resulting buffering circuitry added to generate crosstalk cancellation signals.

Crosstalk cancellation circuitry is then configured in operations 1008-1012. In operation 1008, an amplifier is configured, the amplifier comprising an first amplifier input coupled to the crosstalk victim line, a second amplifier input coupled to a reference, and an amplifier output. In operation 1010, a buffering circuit is configured comprising a crosstalk amplifier, a crosstalk capacitor coupled between the crosstalk aggressor line and a crosstalk amplifier input of the crosstalk amplifier, and a crosstalk resistor coupled between a crosstalk amplifier output and the crosstalk amplifier input, wherein the crosstalk amplifier output is coupled to the first amplifier input. If multiple aggressor lines are identified for a single victim line, this process can be repeated for each aggressor line, with a buffering circuit configured for each aggressor line and the crosstalk cancellation signal for each buffer circuit coupled to the amplifier to be subtracted from the data signal (e.g. including the interference from the aggressor line crosstalk) provided to the first amplifier input by the victim line. In various embodiments, to provide the crosstalk cancellation voltage to a receiver, operation 1012 then involves defining a crosstalk cancellation circuitry output (e.g. output 614, 821, or 921). In some embodiments, this crosstalk cancellation circuitry output can then be capacitively coupled to the input of the AC coupled receiver along with the signal voltage from the victim line, in order to provide improved timing margins for the signal at the receiver.

As detailed above, circuitry arranged in such a fashion in accordance with various embodiments addresses far end crosstalk in a DDR receiver. Such far end crosstalk is often the dominant crosstalk in channels such as DDR5 channels. While crosstalk exists from all lines in a given group of channels (e.g. for a given byte), the dominant crosstalk is from neighboring lines. In embodiments described herein, selected dominant (e.g. adjacent) aggressor lines are assigned crosstalk cancellation circuitry for a victim line (e.g. channel). Such crosstalk cancellation circuitry generates a voltage proportional to a derivative of aggressor line voltage, while also buffering the voltage to make the cancellation voltage resistant to corruption due to kickback or feedback noise from the receiver. Amplification of the crosstalk cancellation signal reduces the load (e.g. additional capacitance) to be added on the aggressor line to generate the crosstalk cancellation voltage for the signal on the victim line. The cancellation voltage is coupled to the receiver capacitively along with the victim channel input. This coupling can be either subtractive or additive depending on whether the dominant crosstalk is capacitive or inductive.

Certain embodiments described herein thus improve the operations of hardware by reduce timing degradation due to crosstalk noise in certain memory receivers and memory devices (e.g. DDR5). This can be implemented by crosstalk cancellation voltages generated with a self-biased inverter or amplifier capacitively coupled into a receiver, using compact low-power circuit components and minimal disruption to the coupled receiver architecture. This improvement is provided to DDR receivers which do not have crosstalk cancellation, or which use crosstalk circuitry which use greater devices resources (e.g. space and power). Previous crosstalk systems describe a direct current coupled receiver with a linear amplifier at the front-end which would involve significant additional circuitry and degrade area, power usage, and other performance of such a system, as well as introducing delay into the cancellation voltage to further degrade performance. Embodiments described herein are related to an alternating current coupled receiver introduce a cancellation voltage to improve timing margins with small delays, space usage, and power usage for generating the crosstalk cancellation voltage. Such embodiments can operate to limit receiver kickback noise In addition to the circuitry arrangement described above, additional circuitry arrangements can describe various different circuitry arrangement embodiments. One such embodiments is a receiver apparatus for a memory device, which includes crosstalk victim and aggressors lines (e.g. channels), an amplifier, and buffering circuits. Such a devices include a crosstalk victim line configured for communications between receiver circuitry and memory, a crosstalk aggressor line configured for communications between the receiver circuitry and the memory, and an amplifier comprising an first amplifier input, an second amplifier input, and an amplifier output. A first buffering circuit comprising a crosstalk amplifier, a crosstalk capacitor coupled between the crosstalk aggressor line and a crosstalk amplifier input of the crosstalk amplifier, and a crosstalk resistor coupled between a crosstalk amplifier output and the crosstalk amplifier input, where the crosstalk amplifier output is coupled to first amplifier input and second amplifier input. In some such embodiments, the first amplifier input is coupled to the crosstalk victim line via a first input capacitor, the second amplifier input is coupled to a reference voltage via a second input capacitor, and the amplifier output is coupled to the receiver circuitry.

Such an embodiment can further comprise differential-to-single ended conversion circuitry where the receiver circuitry comprises single ended receiver circuitry, the amplifier comprises a differential amplifier, and the amplifier output is coupled to the receiver circuitry via the differential-to-single ended conversion circuitry. Such circuitry can also include first coupling circuitry and second coupling circuitry, where the first coupling circuitry comprises a first coupling switch in series with a first coupling capacitor, the second coupling circuitry comprises a second coupling switch in series with a second coupling capacitor, the crosstalk amplifier output is coupled to the first amplifier input via the first coupling circuitry, and the crosstalk amplifier output is coupled to the second amplifier input via the second coupling circuitry. In some such embodiments, the crosstalk capacitor is an adjustable crosstalk cancellation capacitors for the crosstalk aggressor line, and the crosstalk resistor is an adjustable crosstalk cancellation resistors for the crosstalk aggressor line. Some such embodiments operate where values of the adjustable crosstalk cancellation capacitors and the adjustable crosstalk cancellation resistors are selected according to equation 6 above. As described above for equation 6, Vcancellation is a voltage to cancel crosstalk from the crosstalk aggressor line from both inductive and capacitive crosstalk, Vaggressor is a crosstalk aggressor line voltage, s represents frequency in a Laplace domain, Ccrstlk is a capacitance value for the crosstalk capacitor, and Rcrstlk is a resistance value for the crosstalk resistor.

Similarly, some embodiments operate where Ccrstlk and Rcrstlk are determined for inductive crosstalk according to equation 5. As described above for equation 5, Vvictim is a crosstalk voltage generated by inductive crosstalk with the crosstalk aggressor line as part of an expected Vcancellation voltage, Vaggressor is crosstalk aggressor line voltage, s represents frequency is a Laplace domain, Lm is a modeled inductance between the crosstalk victim line and the crosstalk aggressor line, Rterm is a receiver terminal impedance, and Z0 is a characteristic impedance of channels including the crosstalk aggressor line and the crosstalk victim line in the receiver apparatus. Also, in some embodiments, Ccrstlk and Rcrstlk are determined for capacitive crosstalk according to equation 2, where Vvictim2 is a crosstalk voltage generated by capacitive crosstalk with the crosstalk aggressor line as part of an expected Vcancellation voltage, Vaggressor is the crosstalk aggressor line voltage, s represents frequency in a Laplace domain, Ccoup is a modeled coupling capacitance between the crosstalk aggressor line and the crosstalk victim line, Rterm is a receiver termination impedance, Z0 is a characteristic line impedance, and Rterm||Z0 is a parallel impedance of such values.

Some embodiments operate with a crosstalk victim line configured for communications between receiver circuitry and memory, a plurality of crosstalk aggressor lines configured for communications between the receiver circuitry and the memory and proximate to the crosstalk victim line, and for each corresponding crosstalk aggressor line of the plurality of crosstalk aggressor lines, a corresponding crosstalk buffering circuit each comprising a corresponding crosstalk amplifier, a corresponding crosstalk resistor, and a corresponding crosstalk capacitor, where the corresponding crosstalk buffering circuits are configured to generate a corresponding cancellation voltage for corresponding crosstalk interference on the crosstalk victim line from said each corresponding crosstalk aggressor line of the plurality of crosstalk aggressor lines. In such embodiments, a first output of the corresponding crosstalk buffering circuit is coupled to the first amplifier input and to the second amplifier input, with the active connection selected by switching circuitry with the other (e.g. non-active) connection not selected (e.g. with an open switch).

Other embodiments operate with a plurality of crosstalk victim lines configured for communications between receiver circuitry and memory. In such embodiments, for each of the plurality of crosstalk victim lines, one or more crosstalk aggressor lines is configured for communications between the receiver circuitry and the memory and proximate to the crosstalk victim line. A corresponding amplifier is configured for each of the plurality of crosstalk victim lines, with each corresponding amplifier comprising a corresponding first amplifier input, a corresponding second amplifier input, and a corresponding amplifier output coupled to the receiver circuitry. For each corresponding crosstalk aggressor line of the one or more crosstalk aggressor lines, a corresponding crosstalk buffering circuit is configured, each comprising a corresponding crosstalk amplifier, a corresponding crosstalk resistor, and a corresponding crosstalk capacitor. The corresponding crosstalk buffering circuit are configured to generate a corresponding cancellation voltage for corresponding crosstalk interference on the crosstalk victim line. In such embodiments, a first output of the corresponding crosstalk buffering circuit is coupled to the corresponding first amplifier input and the corresponding second amplifier input, with connections controlled by coupling circuitry (e.g. switches) as described above.

In some embodiments, each crosstalk amplifier comprises a p-type metal oxide semiconductor (PMOS) transistor having a gate coupled to the crosstalk capacitor, a source coupled to a voltage power supply, and a drain coupled to a current source and the amplifier, where the current source is coupled between a ground and the drain of the PMOS transistor.

In some embodiments, a disable switch is included, where the crosstalk victim line is connected to the first input capacitor and the first amplifier input via the disable switch when the disable switch is in a first position. Some such embodiments operate where the disable switch is configurable to a second position where the first amplifier input is disconnected from the crosstalk victim line and connected to the reference voltage and the second amplifier input. Some such embodiments operate where the first position is an operating mode position and the second position is an autozero position. Some such embodiments operate where the first buffering circuit further comprises a filter circuit comprising a filter resistor and a filter capacitor coupled in series between the crosstalk amplifier output and a ground, and a filter output between the filter resistor and the filter capacitor. In further such embodiments, the first coupling circuitry further can include a second coupling switch between the filter output and a terminal between the first coupling switch and the first coupling capacitor, the second coupling switch is configured in a closed position during an autozero mode and in an open position during an operating mode, and the first coupling switch is configured in an open position during the autozero mode and in a closed position during the operating mode.

Another such embodiments is a memory interface system with receiver circuitry and crosstalk cancellation circuitry. The receiver circuitry is configured for data communications between a memory and a host via at least a crosstalk victim line and a crosstalk aggressor line. The crosstalk cancellation circuitry is coupled to the receiver circuitry, and include at least an amplifier and buffering circuitry. The amplifier comprises an first amplifier input, an second amplifier input, and an amplifier output. First buffering circuit comprising a crosstalk amplifier, a crosstalk capacitor coupled between the crosstalk aggressor line and a crosstalk amplifier input of the crosstalk amplifier, and a crosstalk resistor coupled between a crosstalk amplifier output and the crosstalk amplifier input, where the crosstalk amplifier output is coupled to the first amplifier input. In such an embodiments, the first amplifier input is coupled to the crosstalk victim line via a first input capacitor, the second amplifier input is coupled to a reference voltage via a second input capacitor, and the amplifier output is coupled to the receiver circuitry.

Additional component arrangements can include various repeated and additional elements in accordance with a particular implementation of the above described receiver cancellation circuitry. The component arrangement is then used to fabricate (e.g. generate) or initiate generation of an integrated circuit using the component arrangement. In various embodiments, various devices, systems, and methods are used to fabricate devices based on the updated circuit design. In some embodiments, this includes generation of masks, and the use of machinery for circuit fabrication. In various implementations, files generated by embodiments described herein are used to create photolithographic masks for lithography operations used to generate circuits according to a circuit design, where a pattern defined by the masks is used in applying a thin uniform layer of viscous liquid (photo-resist) on the wafer surface. The photo-resist is hardened by baking and then selectively removed by projection of light through a reticle containing mask information. In some implementations, the files are further used for etching patterning, where unwanted material from the surface of the wafer is removed according to details described in the design files, where a pattern of the photo-resist is transferred to the wafer by means of etching agents. In some embodiments, aspects of design files generated according to the operations described herein are used for deposition operations, where films of the various materials are applied on the wafer. This may involve physical vapor deposition (PVD), chemical vapor deposition (CVD) or any such similar processes. Some embodiments may use files generated according to operations described herein for chemical mechanical polishing, where a chemical slurry with etchant agents is used to planarize to the wafer surface; for oxidation where dry oxidation or wet oxidation molecules convert silicon layers on top of the wafer to silicon dioxide; for ion implantation where dopant impurities are introduced into a semiconductor using a patterned electrical field; or for diffusion where bombardment-induced lattice defects are annealed. Thus, in various embodiments, systems and operations include not only computing devices for generating updated circuit design files, but also hardware systems for fabricating masks, controlling IC fabrication hardware, and the hardware and operations for fabricating a circuit from a circuit design (e.g. component arrangement) generated in accordance with various embodiments described herein.

Some embodiments described herein relate to circuits designed in complementary metal-oxide-semiconductor (CMOS) field-effect transistors. These transistors are used in some digital integrated circuits for their simplicity, low cost, high density, and low power dissipation. Specifically, CMOS transistors only dissipate power while dynamically switching and exhibit no static power dissipation. The CMOS transistors are either of an N-type or a P-type, which refers to the doping content of the channel of the transistor. For example, an N-channel CMOS transistor produces an N-channel when the gate voltage exceeds a threshold. The N-type or N-channel transistors will be referred to as N-channel metal-oxide-semiconductor (NMOS) field-effect transistors (FETs), and the P-type or P-channel transistors will be referred to as P-channel metal-oxide-semiconductor (PMOS) FETs. Common voltages used to describe these transistors are the gate-to-source voltage ($V_{gs}$), drain-to-source voltage ($V_{ds}$), and threshold voltage ($V_t$). The current through the transistors is the drain-to-source current ($I_{ds}$). For NMOS transistors, all these values, in some embodiments, are positive, and for PMOS transistors, in some embodiments, all these values are negative. In various embodiments described herein, the PMOS voltages and current will be described in terms of absolute values. Specifically, when referring to PMOS transistors, the gate-to-source voltage will mean $|V_{gs}|$, the drain-to-source voltage will mean $|V_{ds}|$, the threshold voltage will mean $|V_t|$, and the drain-to-source current will mean $|I_{ds}|$. Anywhere herein where particular values are used, including specific values (e.g., 0 volts, 0.7 volts, etc.), it is to be understood that this is referring to a target value that operates within a variation tolerance around or approximate to the described value, where the variation is within tolerances set by the specific implementation (e.g., +/−0.05 volts, etc.).

Additionally, it will be apparent that any apparatus or operations described herein in accordance with various embodiments may be structured with intervening, repeated, or other elements while still remaining within the scope of the contemplated embodiments. Some embodiments may include multiple receivers, along with any other circuit elements. Some embodiments may function with described operating modes as well as other operating modes. The various embodiments described herein are thus presented as examples, and do not exhaustively describe every possible implementation in accordance with the possible embodiments.

Figure 11:
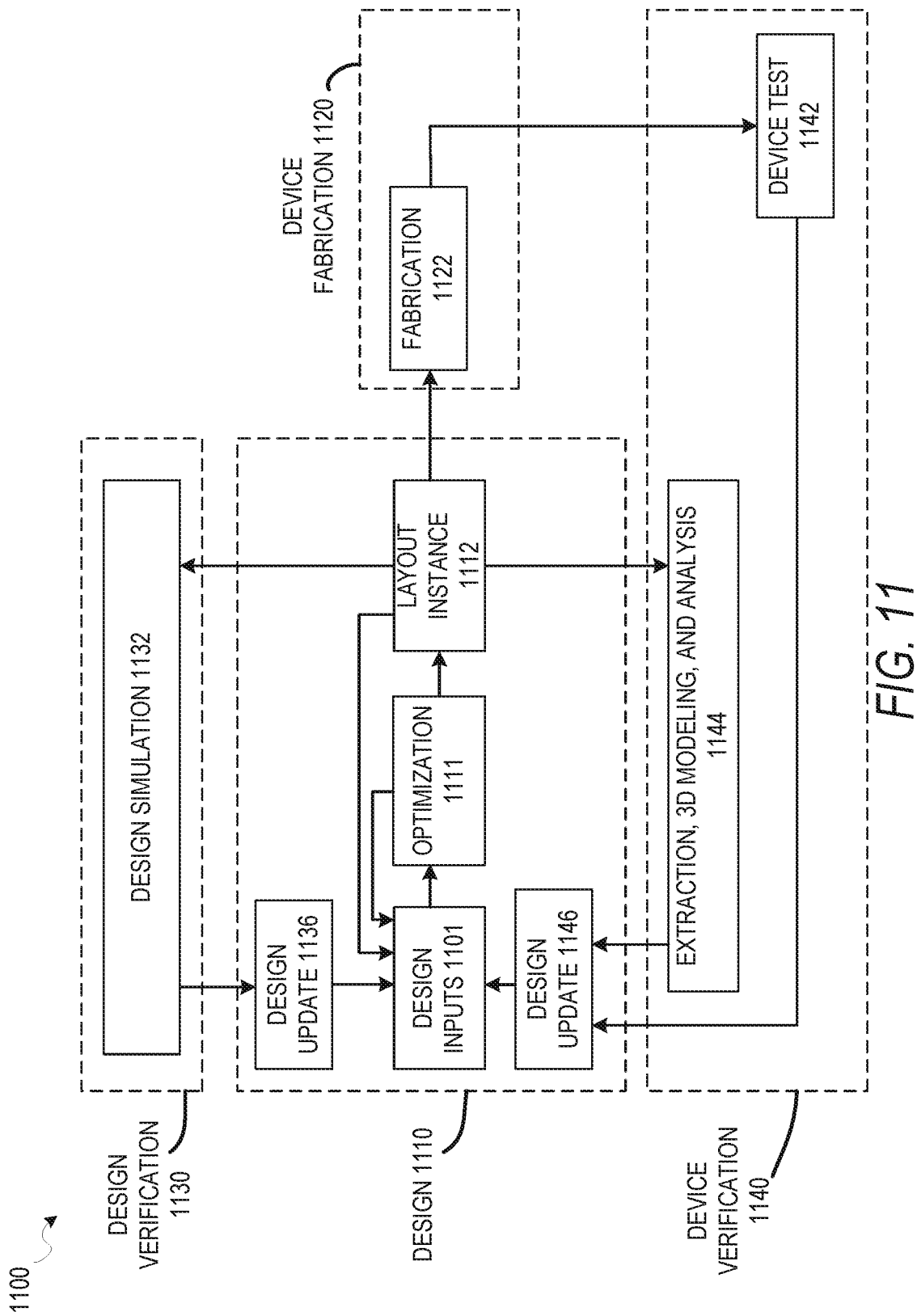
FIG. 11 is a diagram illustrating an example design process flow for generating a circuit including embodiments to implement receiver circuits to interface a microprocessor with memory, in accordance with some embodiments.

FIG. 11 is a diagram illustrating one possible design process flow for generating a circuit including embodiments to implement receiver circuits to interface a microprocessor with memory, in accordance with some embodiments. As illustrated, the overall design flow 1100 includes a design phase 1110, a device fabrication phase 1120, a design verification phase 1130, and a device verification phase 1140. The design phase 1110 involves an initial design input operation 1101 where the basic elements and functionality of a device are determined, as well as revisions based on various analyses and optimization of a circuit design. This design input operation 1101 is where instances of a design arrangement are used in the design and any additional circuitry is selected. The initial strategy, tactics, and context for the device to be created are also generated in the design input operation 1101, depending on the particular design algorithm to be used.

In some embodiments, following an initial selection of design values in the design input operation 1101, timing analysis and optimization, according to various embodiments, occurs in an optimization operation 1111, along with any other automated design processes. One such process may be the automated design of control circuitry to switch a DDR programmable level translator device depending on the type of DDR memory being accessed. As described below, design constraints for arrangements of a circuit design generated with design inputs in the design input operation 1101 may be analyzed using hierarchical timing analysis according to various embodiments. While the design flow 1100 shows such optimization occurring prior to a layout instance 1112, such hierarchical timing analysis and optimization may be performed at any time to verify operation of a circuit design. For example, in various embodiments, constraints for arrangements in a circuit design may be generated prior to routing of connections in a circuit design, after routing, during register transfer level (RTL) operations, or as part of a final signoff optimization or verification prior to a device fabrication operation 1122.

After design inputs are used in the design input operation 1101 to generate a circuit layout, and any optimization operations 1111 are performed, a layout is generated in the layout instance 1112. The layout describes the physical layout dimensions of the device that match the design inputs. This layout may then be used in a fabrication operation 1122 to generate a device, or additional testing and design updates may be performed using designer inputs or automated updates based on design simulation 1132 operations or three-dimensional structure modeling and analysis 1144 operations. Once the device is generated, the device can be tested as part of device test 1142 operations, and layout modifications generated based on actual device performance.

As described in more detail below, design updates 1136 from design simulation 1132 operations, design updates 1146 from device test 1142 or 3D modeling and analysis 1144 operations, or a direct design input operation 1101 may occur after an initial layout instance 1112 is generated. In various embodiments, whenever design inputs are used to update or change an aspect of a circuit design, a timing analysis and optimization operation 1111 may be performed.

For example, in various embodiments, a user may provide an input to an EDA computing device indicating placement of an instance of a design arrangement within a first portion of a circuit design. Once a design is ready, another input to the EDA computing device may be used to generate constraints for each instance of the design arrangement, and a timing analysis may be performed using the constraints. An output to a display of the EDA computing device may show results of the timing analysis, or may show optimizations recommended or automatically perform adjustments to the circuit design based on the timing analysis. Further inputs to the EDA computing device may involve adjustments as user design inputs, with additional timing analysis and optimization initiated via user operation of the EDA computing device.

Figure 12:
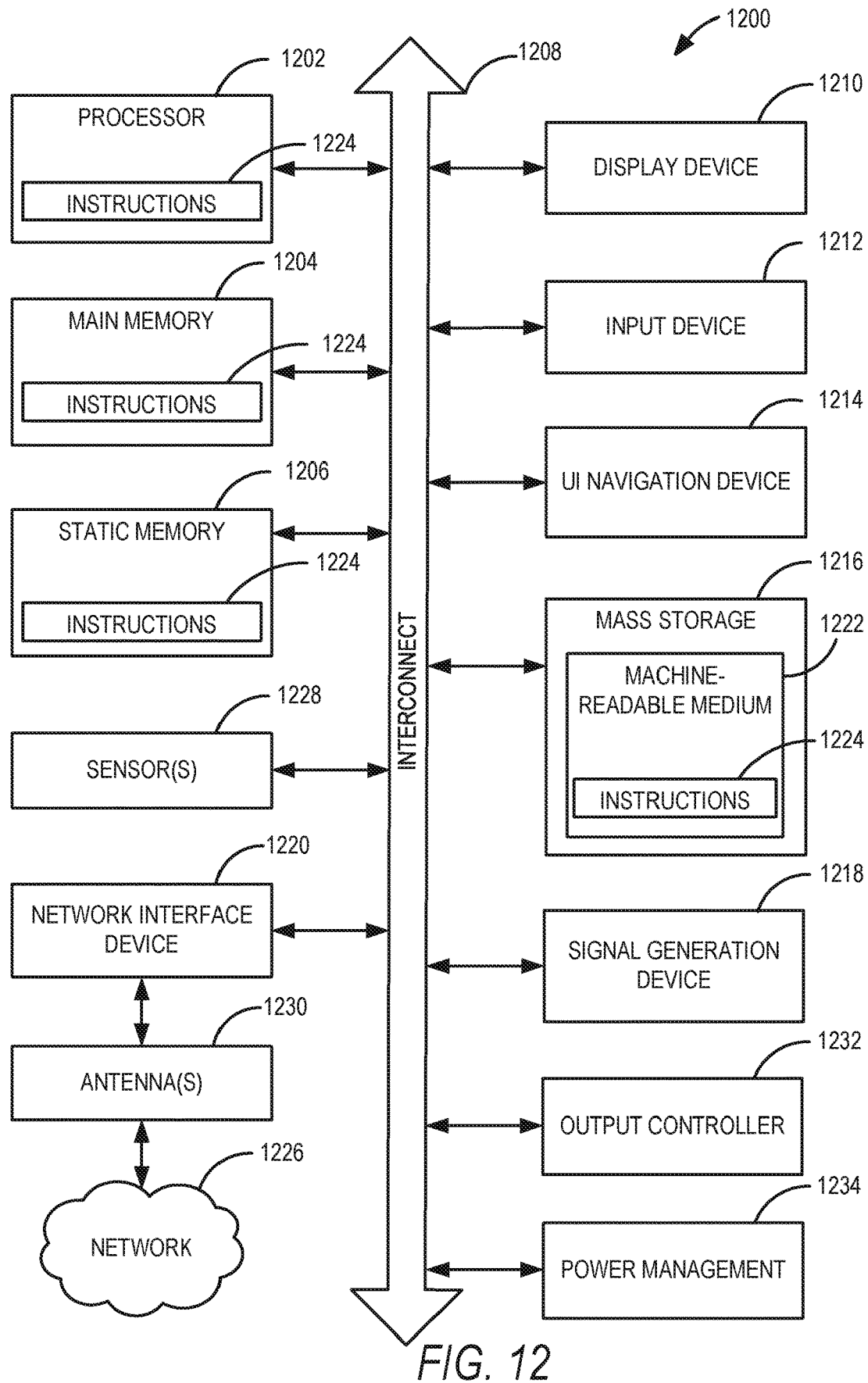
FIG. 12 is an arrangement diagram illustrating an example computer system machine upon which any one or more of the methodologies herein discussed can be run.

FIG. 12 is an arrangement diagram illustrating an example computer system machine 1200 upon which any one or more of the methodologies herein discussed can be run. The computer system machine 1200 or elements of the computer system machine 1200 may be used to implement any device, a mobile phone, tablet, laptop wireless access point, wireless station device, or any other such device described herein. In various other embodiments, different device components or multiples of any element may be used in different devices. Some embodiments may involve the use of a computer system machine 1200 running electronic design automation tools to aid in the design and creation of hardware systems. In various alternative embodiments, the computer system machine 1200 operates as a standalone device or can be connected (e.g., networked) to other machines. In a networked deployment, the computer system machine 1200 can operate in the capacity of either a server or a client machine in server-client network environments, or it can act as a peer machine in peer-to-peer (or distributed) network environments. The computer system machine 1200 can be a personal computer (PC) that may or may not be portable (e.g., a notebook or a netbook), a tablet, a set-top box (STB), a gaming console, a personal digital assistant (PDA), a mobile telephone or smartphone, a web appliance, a network router, a network switch, a network bridge, or any machine capable of executing instructions (sequential or otherwise) that specify actions to be taken by that machine. Further, while only a single computer system machine 1200 is illustrated, the term "machine" shall also be taken to include any collection of machines that individually or jointly execute a set (or multiple sets) of instructions to perform any one or more of the methodologies discussed herein.

The example computer system machine 1200 includes a processor 1202 (e.g., a central processing unit (CPU), a graphics processing unit (GPU), or both), a main memory 1204, and a static memory 1206, which communicate with each other via an interconnect 1208 (e.g., a link, a bus, etc.). The computer system machine 1200 can further include a display device 1210, an alphanumeric input device 1212 (e.g., a keyboard), and a user interface (UI) navigation device 1214 (e.g., a mouse). In one embodiment, the display device 1210, input device 1212, and UI navigation device 1214 are a touch screen display. The computer system machine 1200 can additionally include a storage device 1216 (e.g., a drive unit), a signal generation device 1218 (e.g., a speaker), an output controller 1232, a power management controller 1234, a network interface device 1220 (which can include or operably communicate with one or more antennas 1230, transceivers, or other wireless communications hardware), and one or more sensors 1228, such as a Global Positioning System (GPS) sensor, compass, location sensor, accelerometer, or other sensor.

The storage device 1216 includes a machine-readable medium 1222 on which is stored one or more sets of data structures and instructions 1224 (e.g., software) embodying or utilized by any one or more of the methodologies or functions described herein. The instructions 1224 can also reside, completely or at least partially, within the main memory 1204, within the static memory 1206, and/or within the processor 1202 during execution thereof by the computer system machine 1200, with the main memory 1204, the static memory 1206, and the processor 1202 also constituting machine-readable media 1222.

While the machine-readable medium 1222 is illustrated in an example embodiment to be a single medium, the term "machine-readable medium" can include a single medium or multiple media (e.g., a centralized or distributed database, and/or associated caches and servers) that store the one or more instructions 1224. The term "machine-readable medium" shall also be taken to include any tangible medium that is capable of storing, encoding, or carrying the instructions 1224 for execution by the computer system machine 1200 and that cause the computer system machine 1200 to perform any one or more of the methodologies of the present disclosure or that is capable of storing, encoding, or carrying data structures utilized by or associated with such instructions 1224.

Various techniques, or certain aspects or portions thereof, may take the form of program code (i.e., instructions 1224) embodied in tangible media, such as floppy diskettes, CD-ROMs, hard drives, a non-transitory computer-readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor 1202, a storage medium readable by the processor 1202 (including volatile and non-volatile memory and/or storage elements), at least one input device 1212, and at least one output device. The volatile and non-volatile memory and/or storage elements may be a RAM, erasable programmable read only memory (EPROM), flash drive, optical drive, magnetic hard drive, or other medium for storing electronic data. One or more programs that may implement or utilize the various techniques described herein may use an application programming interface (API), reusable controls, and the like. Such programs may be implemented in a high-level procedural or object-oriented programming language to communicate with a computer system. However, the program(s) may be implemented in assembly or machine language, if desired. In any case, the language may be a compiled or interpreted language, and combined with hardware implementations.

The embodiments described above can be implemented in one or a combination of hardware, firmware, and software. Various methods or techniques, or certain aspects or portions thereof, can take the form of program code (i.e., instructions 1224) embodied in tangible media, such as flash memory, hard drives, portable storage devices, read-only memory (ROM), RAM, semiconductor memory devices (e.g., EPROM, electrically erasable programmable read-only memory (EEPROM)), magnetic disk storage media, optical storage media, and any other machine-readable medium 1222 or storage device 1216 wherein, when the program code is loaded into and executed by a computer system machine 1200, such as a computer or networking device, the computer system machine 1200 becomes an apparatus for practicing the various techniques.

A machine-readable medium 1222 or other storage device 1216 can include any non-transitory mechanism for storing information in a form readable by a computer system machine 1200 (e.g., a computer).

It should be understood that the functional units or capabilities described in this specification can have been referred to or labeled as components or modules, in order to more particularly emphasize their implementation independence. For example, a component or module can be implemented as a hardware circuit comprising custom very-large-scale integration (VLSI) circuits or gate arrays, off-the-shelf semiconductors such as logic chips, transistors, or other discrete components. A component or module can also be implemented in programmable hardware devices such as field-programmable gate arrays, programmable array logic, programmable logic devices, or the like. Components or modules can also be implemented in software for execution by various types of processors. An identified component or module of executable code can, for instance, comprise one or more physical or logical arrangements of computer instructions 1224, which can, for instance, be organized as an object, procedure, or function. Nevertheless, the executables of an identified component or module need not be physically located together, but can comprise disparate instructions 1224 stored in different locations, which, when joined logically together, comprise the component or module and achieve the stated purpose for the component or module.

Indeed, a component or module of executable code can be a single instruction, or many instructions 1224, and can even be distributed over several different code segments, among different programs, and across several memory devices. Similarly, operational data can be identified and illustrated herein within components or modules, and can be embodied in any suitable form and organized within any suitable type of data structure. The operational data can be collected as a single data set, or can be distributed over different locations including over different storage devices 1216, and can exist, at least partially, merely as electronic signals on a system or network. The components or modules can be passive or active, including agents operable to perform desired functions.

We claim:

1. A receiver apparatus for a memory device, the receiver apparatus comprising:
    a crosstalk victim line configured for communications between receiver circuitry and memory;
    a crosstalk aggressor line configured for communications between the receiver circuitry and the memory;
    an amplifier comprising a first amplifier input coupled to the crosstalk victim line, a second amplifier input coupled to a reference voltage, and an amplifier output;
    a buffering circuit comprising a crosstalk amplifier, a crosstalk capacitor coupled between the crosstalk aggressor line and a crosstalk amplifier input of the crosstalk amplifier, and a crosstalk resistor coupled between a crosstalk amplifier output and the crosstalk amplifier input, wherein the crosstalk amplifier output is coupled to the first amplifier input.

2. The receiver apparatus of claim 1, further comprising differential-to-single ended conversion circuitry;
    wherein the receiver circuitry comprises single ended receiver circuitry;
    wherein the amplifier comprises a differential amplifier; and
    wherein the amplifier output is coupled to the receiver circuitry via the differential-to-single ended conversion circuitry.

3. The receiver apparatus of claim 1, further comprising coupling circuitry;
    wherein the coupling circuitry comprises a first coupling switch in series with a first coupling capacitor and a second coupling switch in series with the first coupling capacitor;
    wherein the crosstalk amplifier output is coupled to the first amplifier input via the first coupling switch; and
    wherein the crosstalk amplifier output is coupled to the second amplifier input via the second coupling switch.

4. The receiver apparatus of claim 3, wherein the crosstalk capacitor is an adjustable crosstalk cancellation capacitor for the crosstalk aggressor line; and
    wherein the crosstalk resistor is an adjustable crosstalk cancellation resistor for the crosstalk aggressor line.

5. The receiver apparatus of claim 4, wherein values of the adjustable crosstalk cancellation capacitor and the adjustable crosstalk cancellation resistor are selected according to:

$$V_{CANCELLATION} = V_{AGGRESSOR} s C_{CRSTLK} R_{CRSTLK}$$

where Vcancellation is a voltage to cancel crosstalk from the crosstalk aggressor line from both inductive and capacitive crosstalk, Vaggressor is a crosstalk aggressor line voltage, s represents frequency in a Laplace domain, Ccrstlk is a capacitance value for the crosstalk capacitor, and Rcrstlk is a resistance value for the crosstalk resistor.

6. The receiver apparatus of claim 5, wherein Ccrstlk and Rcrstlk are determined for inductive crosstalk according to:

$$V_{VICTIM} = -s L_M V_{AGGRESSOR} \frac{R_{TERM}}{Z_O + R_{TERM}}$$

where Vvictim is a crosstalk voltage generated by inductive crosstalk with the crosstalk aggressor line as part of an expected Vcancellation voltage, Vaggressor is crosstalk aggressor line voltage, s represents frequency in a Laplace domain, Lm is a modeled inductance between the crosstalk victim line and the crosstalk aggressor line, Rterm is a terminal impedance, and Z0 is a characteristic impedance of channels including the crosstalk aggressor line and the crosstalk victim line in the receiver apparatus.

7. The receiver apparatus of claim 6, wherein Ccrstlk and Rcrstlk are determined for capacitive crosstalk according to:

$$Vvictim2 = Vaggressor \times s Ccoup(Rterm\|Z0),$$

where Vvictim2 is a crosstalk voltage generated by capacitive crosstalk with the crosstalk aggressor line as part of an expected Vcancellation voltage, Vaggressor is the crosstalk aggressor line voltage, s represents frequency in a Laplace domain, Ccoup is a modeled coupling capacitance between the crosstalk aggressor line and the crosstalk victim line, Rterm is a receiver termination impedance, Z0 is a characteristic line impedance of channels including the crosstalk aggressor line and the crosstalk victim line in the receiver apparatus, and Rterm∥Z0 is a parallel combination of Z0 and Rterm impedances.

8. The receiver apparatus of claim 3, further comprising a plurality of crosstalk aggressor lines configured for communications between the receiver circuitry and the memory and proximate to the crosstalk victim line; and
   for each corresponding crosstalk aggressor line of the plurality of crosstalk aggressor lines, a corresponding crosstalk buffering circuit each comprising a corresponding crosstalk amplifier, a corresponding crosstalk resistor, and a corresponding crosstalk capacitor, wherein the corresponding crosstalk buffering circuit is configured to generate a corresponding cancellation voltage for corresponding crosstalk interference on the crosstalk victim line from said each corresponding crosstalk aggressor line of the plurality of crosstalk aggressor lines, and a corresponding crosstalk buffering circuit output is coupled to the amplifier via corresponding coupling circuitry.

9. The receiver apparatus of claim 3, further comprising a plurality of crosstalk victim lines configured for communications between receiver circuitry and memory;
   for each of the plurality of crosstalk victim lines, one or more crosstalk aggressor lines configured for communications between the receiver circuitry and the memory and proximate to the crosstalk victim line;
   a corresponding amplifier for each of the plurality of crosstalk victim lines, each said corresponding amplifier comprising a corresponding first amplifier input, a corresponding second amplifier input, and a corresponding amplifier output coupled to the receiver circuitry;
   for each corresponding crosstalk aggressor line of the one or more crosstalk aggressor lines, a corresponding crosstalk buffering circuit each comprising a corresponding crosstalk amplifier, a corresponding crosstalk resistor, and a corresponding crosstalk capacitor, wherein the corresponding crosstalk buffering circuit is configured to generate a corresponding cancellation voltage for corresponding crosstalk interference on the crosstalk victim line;
   wherein a first output of the corresponding crosstalk buffering circuit is coupled to the corresponding first amplifier input and the second amplifier input via coupling circuitry comprising at least a first switch coupled to the first amplifier input and a second switch coupled to the second amplifier input.

10. The receiver apparatus of claim 3, wherein the crosstalk amplifier comprises a p-type metal oxide semiconductor (PMOS) transistor having a gate coupled to the crosstalk capacitor, a source coupled to a voltage power supply, and a drain coupled to a current source and the amplifier, wherein the current source is coupled between a ground and the drain of the PMOS transistor.

11. The receiver apparatus of claim 3, further comprising a disable switch, wherein the crosstalk victim line is connected to the first amplifier input via the disable switch and a first input capacitor and when the disable switch is in a first position.

12. The receiver apparatus of claim 11, wherein the disable switch is configurable to a second position where the first amplifier input is disconnected from the crosstalk victim line and connected to the reference voltage and the second amplifier input.

13. The receiver apparatus of claim 12, wherein the first position is an operating mode position and the second position is an autozero position.

14. The receiver apparatus of claim 11, wherein the buffering circuit further comprises a filter circuit comprising a filter resistor and a filter capacitor coupled in series between the crosstalk amplifier output and a ground, and a filter output between the filter resistor and the filter capacitor;
   wherein the coupling circuitry further comprises a third coupling switch between the filter output and a terminal between the first coupling switch and the first coupling capacitor;
   wherein the third coupling switch is configured in a closed position during an autozero mode and in an open position during an operating mode;
   wherein the first coupling switch is configured in an open position during the autozero mode and in a closed position during the operating mode.

15. A memory interface system, comprising:
   receiver circuitry configured for data communications between a memory and a host via at least a crosstalk victim line and a crosstalk aggressor line; and
   crosstalk cancellation circuitry coupled to the receiver circuitry, the crosstalk cancellation circuitry comprising:
      an amplifier comprising a first amplifier input coupled to the crosstalk victim line, a second amplifier input coupled to a reference voltage, and an amplifier output coupled to the receiver circuitry;
      a buffering circuit comprising a crosstalk amplifier, a crosstalk capacitor coupled between the crosstalk aggressor line and a crosstalk amplifier input of the crosstalk amplifier, and a crosstalk resistor coupled between a crosstalk amplifier output and the crosstalk amplifier input, wherein the crosstalk amplifier output is coupled to the first amplifier input and the second amplifier input.

16. The memory interface system of claim 15, wherein the crosstalk amplifier output is coupled to the second amplifier input via a first coupling circuit comprising a first switch;
   wherein the crosstalk amplifier output is coupled to the first amplifier input via a second coupling circuit comprising a second switch; and
   wherein the receiver circuitry comprises:
   an input terminal coupled to the amplifier output;
   one or more voltage reference terminals;

a plurality of receiver arrangements, each receiver arrangement of the plurality of receiver arrangements comprising:
a multi-stage differential amplifier having a first input connected to the input terminal via a first switch and a first autozero capacitor, a second input connected to the one or more voltage reference terminals via a second autozero capacitor, a first output, and a second output; and
a sampling circuit having: inputs connected to the first output and the second output of the multi-stage differential amplifier; and a sampling circuit output;
a second switch coupled to the first input via the first autozero capacitor and the second input via the second autozero capacitor;
a third switch coupled between the first input and the first output; and
a fourth switch coupled between the second input and the second output;
a multiplexer comprising a corresponding input connected to each sampling circuit output of the plurality of receiver arrangements and a multiplexer output; and
an output terminal to the host coupled to the multiplexer output.

17. The memory interface system of claim 15, further comprising a disable switch, wherein the crosstalk victim line is connected to an input capacitor and the first amplifier input via the disable switch when the disable switch is in a first position for an operating mode;
wherein the disable switch is configurable to a second position for an autozero mode where the first amplifier input is disconnected from the crosstalk victim line and connected to the reference voltage and the second amplifier input;
wherein the buffering circuit further comprises a filter circuit comprising a filter resistor and a filter capacitor coupled in series between the crosstalk amplifier output and a ground, and a filter output between the filter resistor and the filter capacitor.

18. A method of configuring a component arrangement in design for an integrated circuit, the method comprising:
defining a plurality of values for the integrated circuit, the plurality of values comprising at least a characteristic impedance for channels of the integrated circuit;
configuring a crosstalk victim line for communications between receiver circuitry and a memory;
configuring a crosstalk aggressor line for communications between the receiver circuitry and the memory;
configuring crosstalk cancellation circuitry comprising:
an amplifier comprising a first amplifier input coupled to the crosstalk victim line, a second amplifier input coupled to a reference, and an amplifier output; and
a buffering circuit comprising a crosstalk amplifier, a crosstalk capacitor coupled between the crosstalk aggressor line and a crosstalk amplifier input of the crosstalk amplifier, and a crosstalk resistor coupled between a crosstalk amplifier output and the crosstalk amplifier input, wherein the crosstalk amplifier output is coupled to the first amplifier input;
defining a crosstalk cancellation circuitry output.

19. The method of claim 18, further comprising:
defining autozero mode circuitry comprising:
a disable switch, wherein the crosstalk victim line is connected to an input capacitor and the first amplifier input via the disable switch when the disable switch is in a first position for an operating mode, wherein the disable switch is configurable to a second position for an autozero mode where the first amplifier input is disconnected from the crosstalk victim line and connected to the reference; and
a filter circuit of the buffering circuit comprising a filter resistor and a filter capacitor coupled in series between the crosstalk amplifier output and a ground, and a filter output between the filter resistor and the filter capacitor.

20. The method of claim 19, further comprising initiating fabrication of the integrated circuit using the component arrangement in the design for using with a memory interface device.

* * * * *